(12) United States Patent
Kim et al.

(10) Patent No.: US 12,376,407 B2
(45) Date of Patent: Jul. 29, 2025

(54) IMAGE SENSOR

(71) Applicant: SAMSUNG ELECTRONICS CO., LTD., Suwon-si (KR)

(72) Inventors: Sang-Hoon Kim, Seongnam-si (KR); Jinju Jeon, Suwon-si (KR); Heegeun Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 723 days.

(21) Appl. No.: 17/693,076

(22) Filed: Mar. 11, 2022

(65) Prior Publication Data

US 2023/0017156 A1 Jan. 19, 2023

(30) Foreign Application Priority Data

Jul. 19, 2021 (KR) .......................... 10-2021-0094017

(51) Int. Cl.
 *H10F 39/00* (2025.01)
(52) U.S. Cl.
 CPC ......... *H10F 39/807* (2025.01); *H10F 39/802* (2025.01); *H10F 39/8053* (2025.01); *H10F 39/8063* (2025.01); *H10F 39/811* (2025.01)
(58) Field of Classification Search
 CPC ......... H01L 27/14643; H01L 27/14645; H01L 27/1463; H10F 39/807; H10F 39/811; H10F 39/18
 See application file for complete search history.

(56) References Cited

U.S. PATENT DOCUMENTS

| | | |
|---|---|---|
| 7,459,668 B2 | 12/2008 | Mauritzson |
| 7,795,676 B2 | 9/2010 | Mabuchi |
| 8,164,124 B2 | 4/2012 | Liu et al. |
| 8,664,734 B2 | 3/2014 | Wu et al. |
| 9,041,071 B2 | 5/2015 | Ahn |
| 10,009,552 B2 | 6/2018 | Velichko et al. |
| 10,163,963 B2 | 12/2018 | Janssens et al. |
| 10,651,226 B2 | 5/2020 | Lee et al. |
| 10,734,481 B2 | 8/2020 | Rao |

(Continued)

FOREIGN PATENT DOCUMENTS

| | | | | |
|---|---|---|---|---|
| JP | 2015076453 A | * | 4/2015 | ....... H01L 27/14607 |
| KR | 2006-0067872 A | | 6/2006 | |

(Continued)

*Primary Examiner* — Davienne N Monbleau
*Assistant Examiner* — Megan Parrish
(74) *Attorney, Agent, or Firm* — Fish & Richardson P.C.

(57) ABSTRACT

An image sensor may include a substrate including first and second surfaces opposite to each other and including a single crystalline layer, a first epitaxial layer, and a second epitaxial layer sequentially stacked from the second surface. The single crystalline layer and the second epitaxial layer may be doped with first impurities of a first conductivity type. The first epitaxial layer may be doped with second impurities of a second conductivity type. A pixel separation structure extends from the first surface to penetrate at least the second and first epitaxial layers and divides the substrate into a plurality of pixels. A transfer gate electrode extends from the first surface to penetrate the second epitaxial layer. A doping concentration of the first impurities doped in the single crystalline layer may be higher than that in the second epitaxial layer.

20 Claims, 18 Drawing Sheets

(56) References Cited

U.S. PATENT DOCUMENTS

| | | | |
|---|---|---|---|
| 2008/0217716 A1 | 9/2008 | Mauritzson | |
| 2017/0040365 A1* | 2/2017 | Lee | H10F 39/813 |
| 2020/0127025 A1* | 4/2020 | Lim | H10F 39/811 |
| 2021/0375669 A1* | 12/2021 | Liu | H10F 39/199 |
| 2022/0223635 A1* | 7/2022 | Kao | H10F 39/811 |
| 2022/0359298 A1* | 11/2022 | More | H10D 84/834 |
| 2023/0269503 A1* | 8/2023 | Oishi | H04N 25/79 |

FOREIGN PATENT DOCUMENTS

| | | | |
|---|---|---|---|
| KR | 2013-0097836 A | 9/2013 | |
| KR | 2018-0081203 A | 7/2018 | |

* cited by examiner

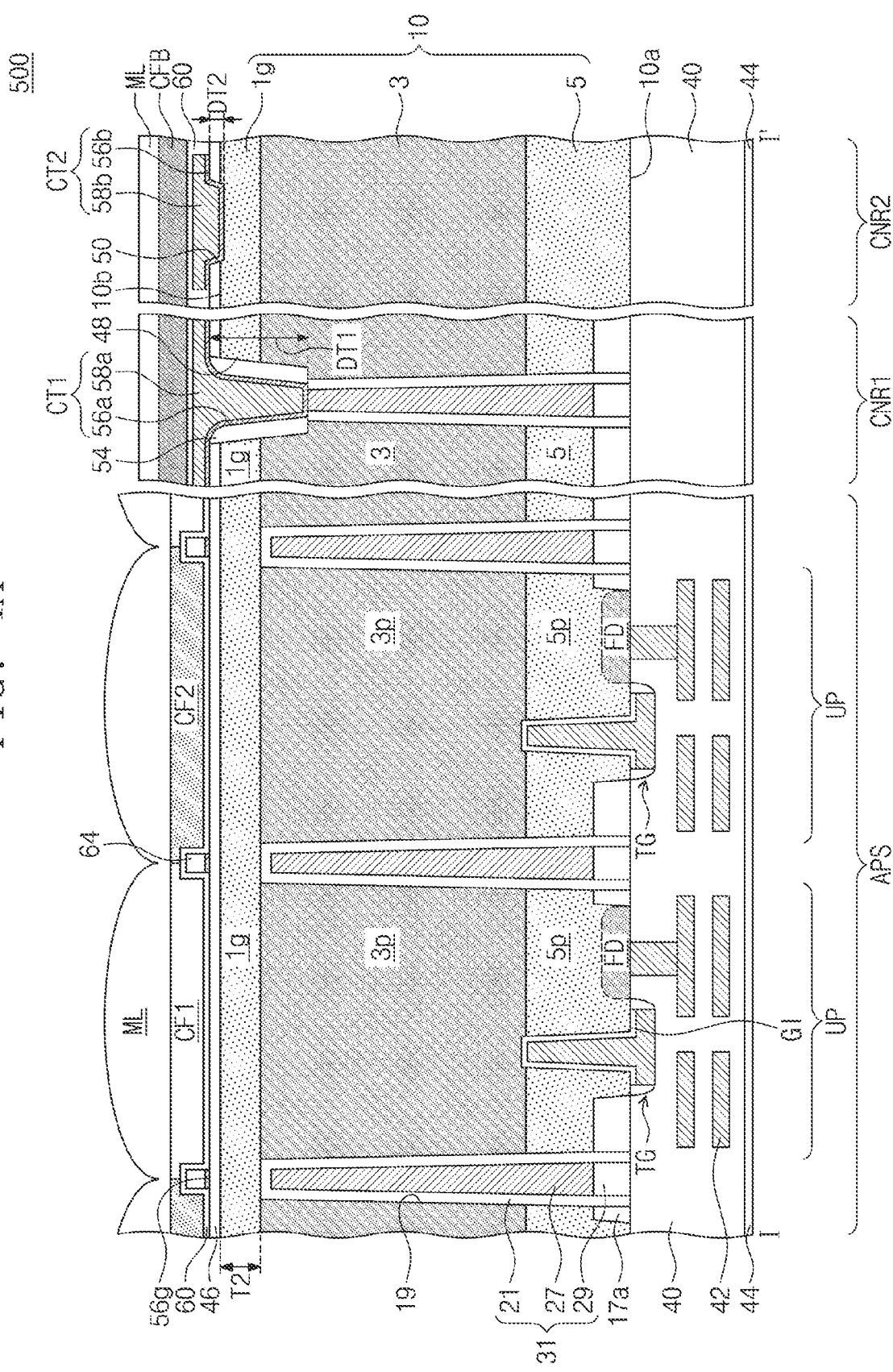

IMAGE SENSOR

CROSS-REFERENCE TO RELATED APPLICATIONS

This U.S. non-provisional patent application claims priority under 35 U.S.C. § 119 to Korean Patent Application No. 10-2021-0094017, filed on Jul. 19, 2021, in the Korean Intellectual Property Office, the entire contents of which are hereby incorporated by reference.

BACKGROUND OF THE DISCLOSURE

The present disclosure relates to an image sensor.

An image sensor is a semiconductor device converting an optical image to electric signals. The image sensor is classified into two types: a charge coupled device (CCD) type and a complementary metal-oxide-semiconductor (CMOS) type. The CMOS-type image sensor is called CIS for short. The CIS includes a plurality of pixels that are two-dimensionally arranged. Each of the pixels includes a photodiode (PD). The photodiode is used to convert incident light to an electric signal.

SUMMARY

An embodiment of the disclosure provides an image sensor capable of realizing an improved image quality.

According to an embodiment of the disclosure, an image sensor may include a substrate including a first surface and a second surface that are opposite to each other. The substrate includes a single crystalline layer, a first epitaxial layer, and a second epitaxial layer that are sequentially stacked from the second surface. The single crystalline layer and the second epitaxial layer being doped with first impurities of a first conductivity type, the first epitaxial layer being doped with second impurities of a second conductivity type, and the second conductivity type being opposite to the first conductivity type. A pixel separation structure extends from the first surface to penetrate at least the second epitaxial layer and the first epitaxial layer and divides the substrate into a plurality of pixels. A transfer gate electrode extends from the first surface to penetrate the second epitaxial layer. A first concentration of the first impurities doped in the single crystalline layer may be higher than a second concentration of the first impurities doped in the second epitaxial layer.

According to an embodiment of the disclosure, an image sensor may include a substrate including a first surface and a second surface that are opposite to each other. The substrate includes a single crystalline layer, a first epitaxial layer, and a second epitaxial layer that are sequentially stacked from the second surface. The single crystalline layer and the second epitaxial layer being doped with first impurities of a first conductivity type, the first epitaxial layer being doped with second impurities of a second conductivity type, and the second conductivity type being opposite to the first conductivity type. A pixel separation structure extends from the first surface to penetrate at least the second epitaxial layer and the first epitaxial layer and divides the substrate into a plurality of pixels. The pixel separation structure includes a separation conductive pattern penetrating the second epitaxial layer and the first epitaxial layer and a separation insulating layer interposed between the separation conductive pattern and the substrate. A transfer gate electrode extends from the first surface to penetrate the second epitaxial layer. A floating diffusion region is disposed in a portion of the second epitaxial layer at a side of the transfer gate electrode. An interlayer insulating layer covers the first surface. An anti-reflection layer covers the second surface, a color filter on the anti-reflection layer, and a micro lens layer on the color filter. The single crystalline layer may have a thickness of 100 Å-1000 Å, and the separation insulating layer may be interposed between the single crystalline layer and the separation conductive pattern.

According to an embodiment of the disclosure, an image sensor may include a substrate including a first surface and a second surface that are opposite to each other. The substrate includes a pixel array region and a connection region. The substrate includes a first epitaxial layer and a second epitaxial layer sequentially stacked from the second surface. The second epitaxial layer being doped with first impurities of a first conductivity type, the first epitaxial layer being doped with second impurities of a second conductivity type, and the second conductivity type being opposite to the first conductivity type. A pixel separation structure extends from the first surface to penetrate at least the second epitaxial layer and the first epitaxial layer, divides the pixel array region of the substrate into a plurality of pixels, and extends to the connection region. The pixel separation structure includes a separation conductive pattern penetrating the second epitaxial layer and the first epitaxial layer and a separation insulating layer interposed between the separation conductive pattern and the substrate. A transfer gate electrode extends from the first surface to penetrate the second epitaxial layer. A contact plug is provided on the connection region to penetrate a portion of the first epitaxial layer and to be in contact with the separation conductive pattern. A contact insulating layer is interposed between the contact plug and the first epitaxial layer.

BRIEF DESCRIPTION OF THE DRAWINGS

FIG. 4A is a sectional view taken along a line I-I' of FIG. 3.

DETAILED DESCRIPTION

Example embodiments of the disclosures will now be described more fully with reference to the accompanying drawings, in which example embodiments are shown.

Figure 1:
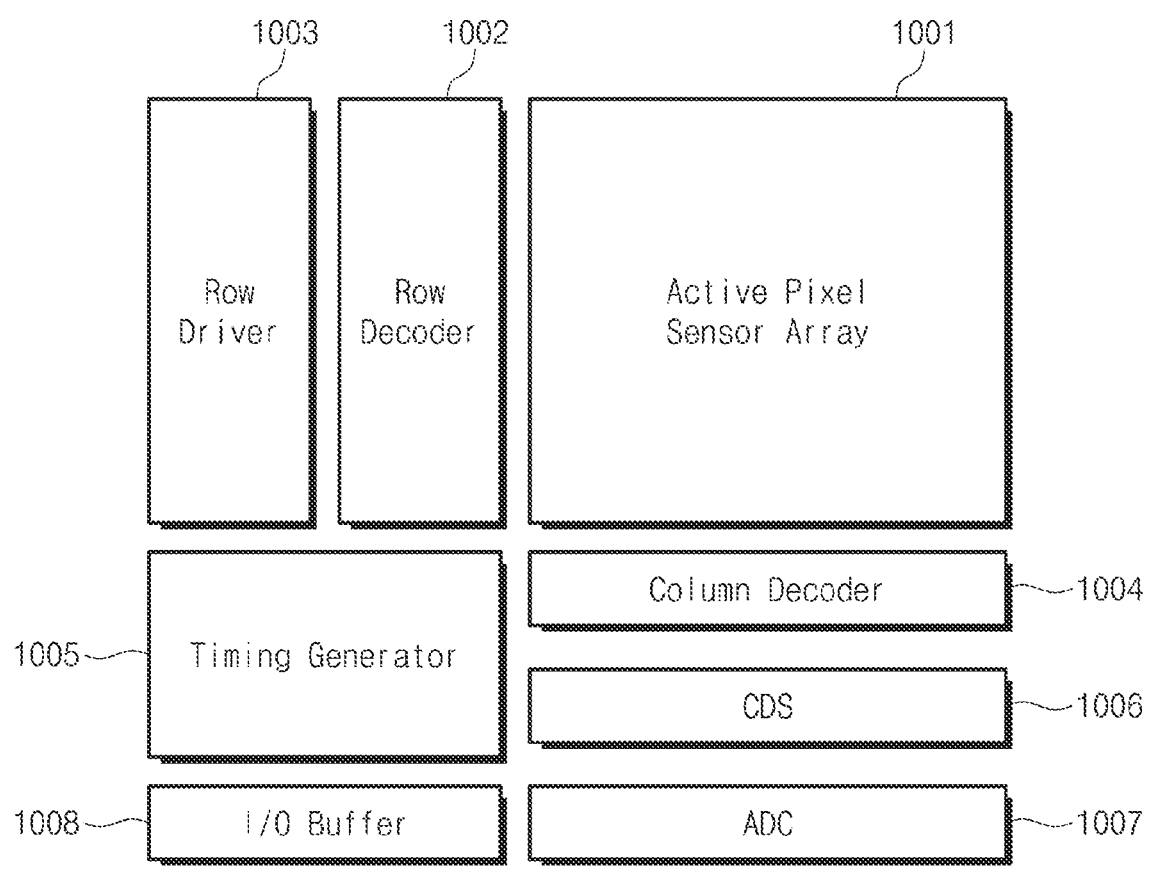
FIG. 1 is a block diagram illustrating an image sensor according to an embodiment of the disclosure.

FIG. 1 is a block diagram illustrating an image sensor according to an embodiment of the disclosure.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output buffer (I/O buffer) 1008.

The active pixel sensor array 1001 may include a plurality of unit pixels, which are two-dimensionally arranged, and may be configured to convert an optical signal to an electrical signal. The active pixel sensor array 1001 may be driven by a plurality of driving signals, such as a pixel selection signal, a reset signal, and a charge transfer signal, which are transmitted from the row driver 1003. In addition, the converted electrical signal may be provided to the correlated double sampler 1006.

The row driver 1003 may be configured to provide a plurality of driving signals for driving the unit pixels of the active pixel sensor array 1001, based on the result decoded by the row decoder 1002. In the case where the unit pixels are arranged in a matrix shape (i.e., in rows and columns), the driving signals may be provided to respective rows.

The timing generator 1005 may be configured to provide a timing signal and a control signal to the row decoder 1002 and the column decoder 1004.

The correlated double sampler 1006 may be configured to receive the electric signals generated by the active pixel sensor array 1001 and to perform a holding and sampling operation on the received electric signals. The correlated double sampler 1006 may perform a double sampling operation using a specific noise level and a signal level of the electric signal and then may output a difference level corresponding to a difference between the noise and signal levels.

The analog-to-digital converter 1007 may be configured to convert an analog signal, which contains information on the difference level outputted from the correlated double sampler 1006, to a digital signal and to output the converted digital signal.

The I/O buffer 1008 may be configured to latch the digital signals and then to sequentially output the latched digital signals to an image signal processing unit (not shown), based on the result decoded by the column decoder 1004.

Figure 2:
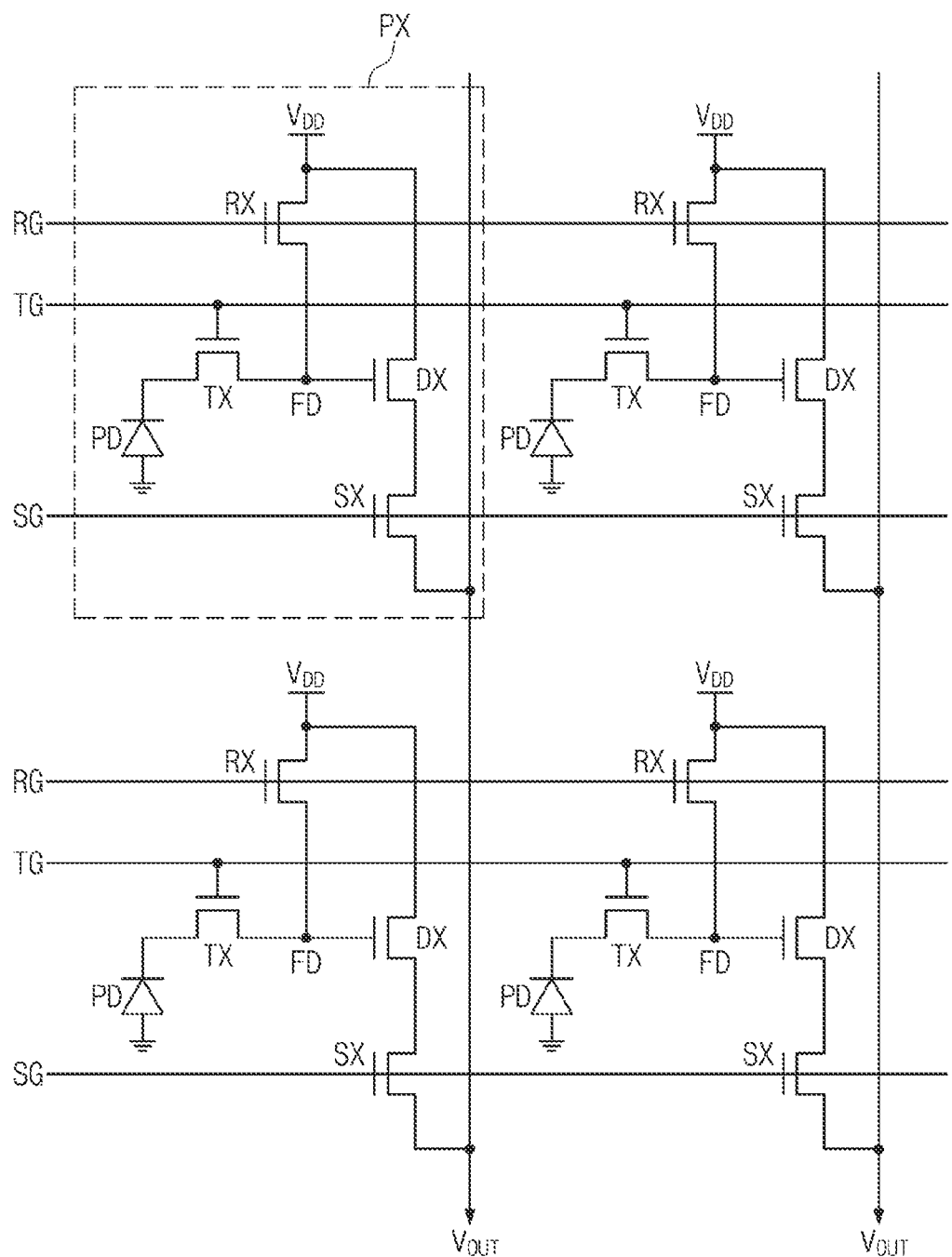
FIG. 2 is a circuit diagram illustrating an active pixel sensor array of an image sensor according to an embodiment of the disclosure.

FIG. 2 is a circuit diagram illustrating an active pixel sensor array of an image sensor according to an embodiment of the disclosure.

Referring to FIGS. 1 and 2, the sensor array 1001 may include a plurality of unit pixel regions PX, which are arranged in a matrix shape. Each of the unit pixel regions PX may include a transfer transistor TX and logic transistors RX, SX, and DX. The logic transistors may include a reset transistor RX, a selection transistor SX, and a source follower transistor DX. The transfer transistor TX may include a transfer gate TG. Each of the unit pixel regions PX may further include a photoelectric conversion device PD and a floating diffusion region FD.

The photoelectric conversion device PD may be configured to generate photocharges whose amount is proportional to an amount of externally incident light and to store the photocharges. The photoelectric conversion device PD may include a photo diode, a photo transistor, a photo gate, a pinned photo diode, or any combination thereof. The transfer transistor TX may be configured to transfer electric charges, which are generated in the photoelectric conversion device PD, to the floating diffusion region FD. The floating diffusion region FD may be configured to receive and cumulatively store the electric charges, which are generated in the photoelectric conversion device PD. The source follower transistor DX may be controlled, based on an amount of photocharges stored in the floating diffusion region FD.

The reset transistor RX may be configured to periodically discharge or reset the photocharges stored in the floating diffusion region FD. The reset transistor RX may include drain and source electrodes, which are connected to the floating diffusion region FD and a power voltage VDD, respectively. If the reset transistor RX is turned on, the power voltage VDD connected to the source electrode of the reset transistor RX may be applied to the floating diffusion region FD. Thus, the reset transistor RX may be turned on, and in this case, the electric charges stored in the floating diffusion region FD may be discharged; that is, the floating diffusion region FD may be reset.

The source follower transistor DX may serve as a source follower buffer amplifier. The source follower transistor DX may be configured to amplify a variation in electric potential of the floating diffusion region FD and to output the amplified signal to an output line Vout.

The selection transistor SX may be used, though a selection gate SG, to select one of the rows of the unit pixel regions PX, during reading operations. If the selection transistor SX is turned on, the power voltage VDD may be applied to a drain electrode of the source follower transistor DX.

Figure 3:
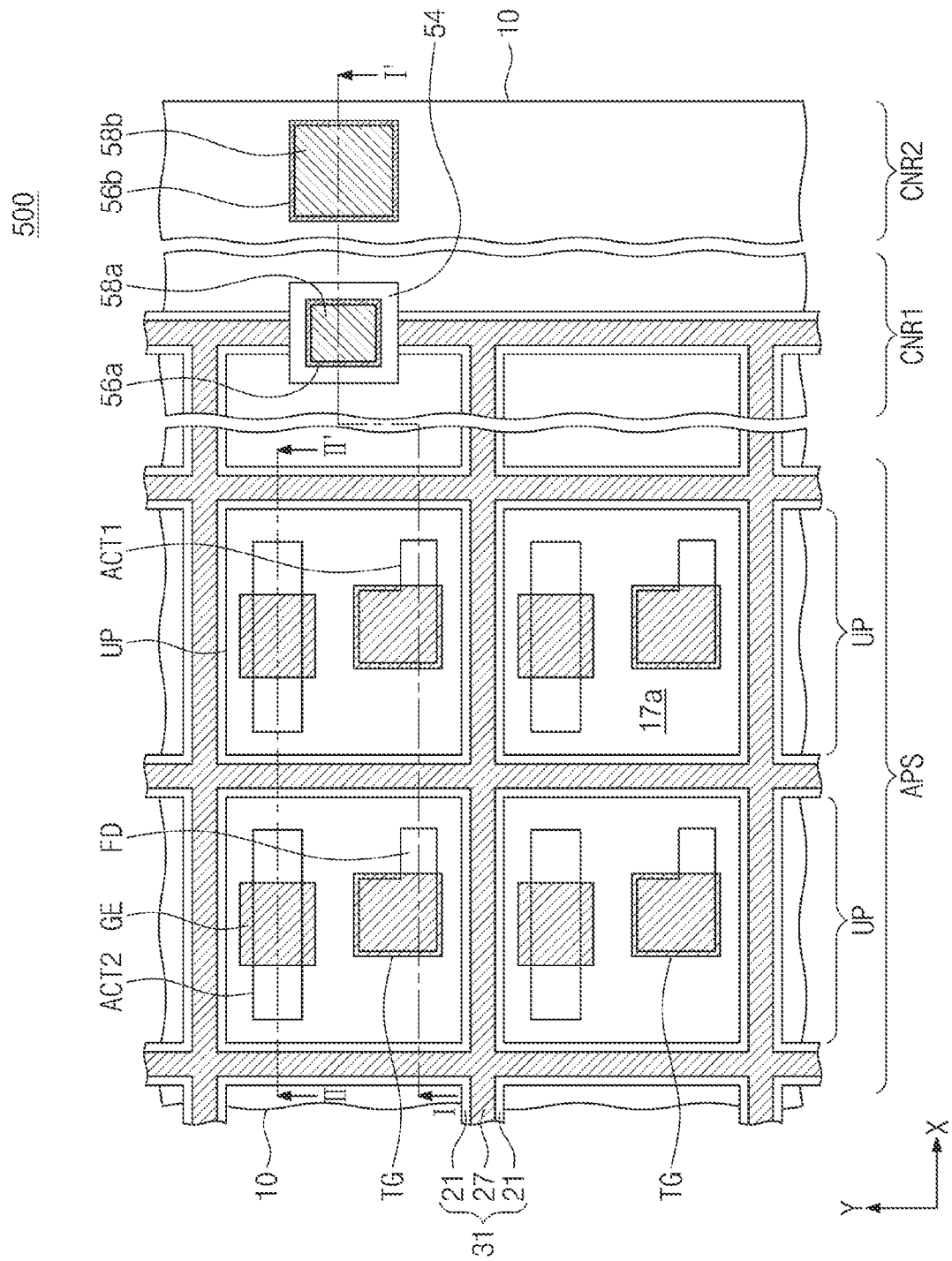
FIG. 3 is a plan view illustrating a semiconductor device according to an embodiment of the disclosure.
Figure 4B:
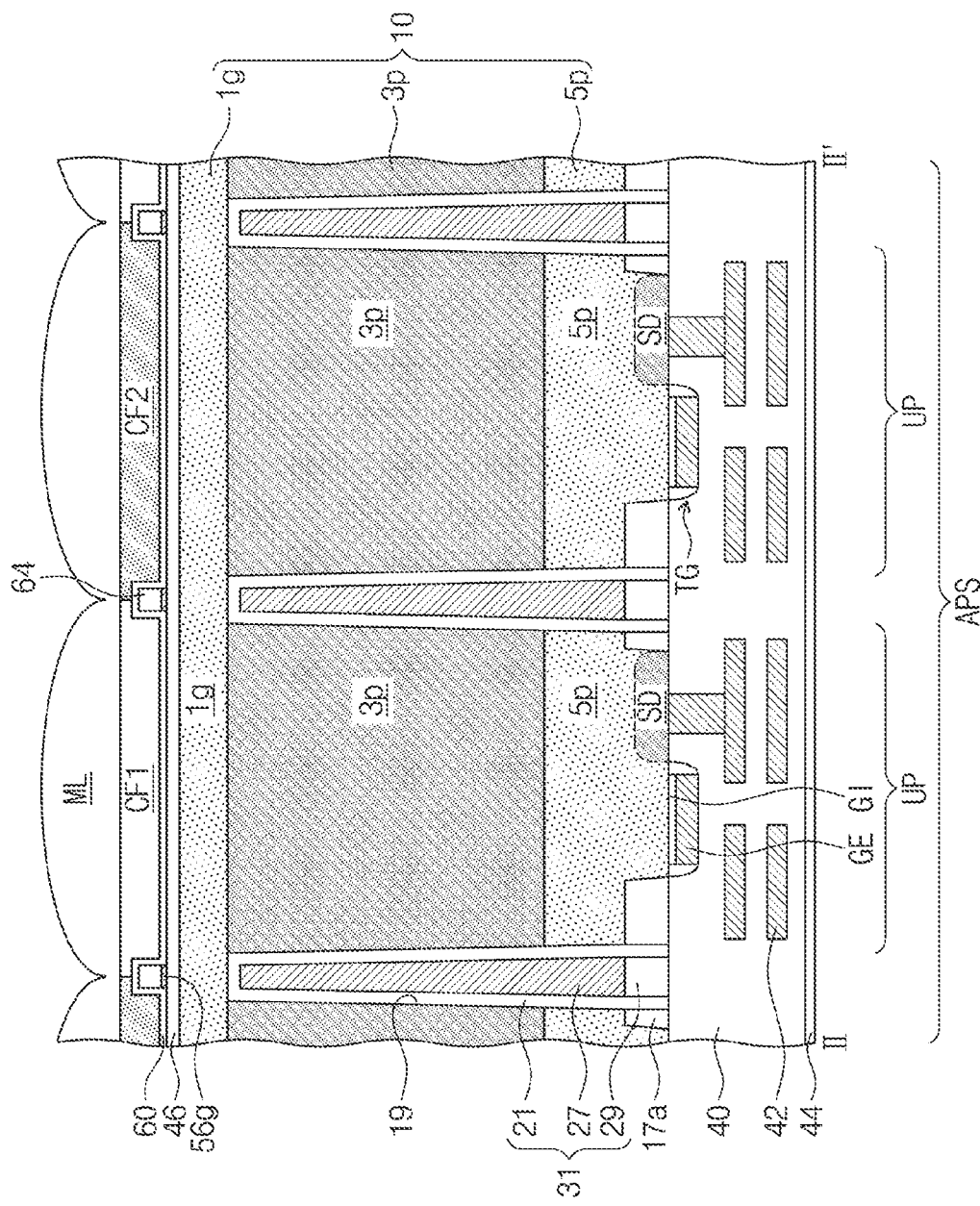
FIG. 4B is a sectional view taken along a line II-II' of FIG. 3.

FIG. 3 is a plan view illustrating a semiconductor device according to an embodiment of the disclosure. FIG. 4A is a sectional view taken along a line I-I' of FIG. 3. FIG. 4B is a sectional view taken along a line II-II' of FIG. 3.

Referring to FIGS. 3, 4A, and 4B, an image sensor 500 according to the present embodiment may include a first substrate 10. The first substrate 10 may include a first surface 10a and a second surface 10b (see FIG. 4A), which are opposite to each other. The first substrate 10 may include a pixel array region APS, which includes a plurality of unit pixels UP, and a first connection region CNR1 and a second connection region CNR2, which are placed outside the pixel array region APS.

The first substrate 10 may include a single crystalline layer 1g, a first epitaxial layer 3, and a second epitaxial layer 5, which are stacked in a direction from the second surface 10b toward the first surface 10a. For example, each of the single crystalline layer 1g, the first epitaxial layer 3, and the second epitaxial layer 5 may be a silicon single crystalline layer. Accordingly, the single crystalline layer 1g may be referred to as a 'first single crystalline layer', the first epitaxial layer 3 may be referred to as a 'second single crystalline layer', and the second epitaxial layer 5 may be referred to as a 'third single crystalline layer'.

In FIG. 4A, the first surface 10a may correspond to a bottom surface of the second epitaxial layer 5, and the second surface 10b may correspond to a top surface of the single crystalline layer 1g. The single crystalline layer Ig may have a second thickness T2. In an embodiment, the second thickness T2 may range from 100 Å to 1000 Å.

The single crystalline layer 1g and the second epitaxial layer 5 may be doped with first impurities of a first conductivity type. The first epitaxial layer 3 may be doped with second impurities, which are of a second conductivity type different from the first conductivity type. A first concentration of the first impurities in the single crystalline layer 1g may be higher than a second concentration of the first impurities in the second epitaxial layer 5. In an embodiment, the first concentration may be 10 to 10000 times the second concentration. In an embodiment, the first conductivity type may be a p-type, and the first impurities may be boron (B). In addition, the second conductivity type may be an n-type, and the second impurities may be phosphorus (P).

A pixel separation structure 31 may be disposed in the pixel array region APS of the first substrate 10 to separate the unit pixels UP from each other. The pixel separation structure 31 may be used to prevent a cross-talk issue from occurring between adjacent ones of the unit pixels UP. The pixel separation structure 31 may extend from the first surface 10a to penetrate the second epitaxial layer 5 and the first epitaxial layer 3 and to be in contact with the single crystalline layer 1g.

In the pixel array region APS, the first epitaxial layer 3 may be divided into first epitaxial patterns 3p by the pixel separation structure 31. In the pixel array region APS, the second epitaxial layer 5 may be divided into second epitaxial patterns 5p by the pixel separation structure 31. In the unit pixels UP, the first epitaxial patterns 3p, in conjunction with each of the single crystalline layer 1g and/or the second epitaxial patterns 5p adjacent thereto, may form a pn junction, which is used as the photoelectric conversion device PD of FIG. 2 or a photoelectric conversion part. In the unit pixels UP, the second epitaxial patterns 5p may be used as well regions. The first epitaxial patterns 3p may be referred to as a 'first epitaxial layer'. The second epitaxial patterns 5p may be referred to as a 'second epitaxial layer'.

The pixel separation structure 31 may be in direct contact with the first epitaxial patterns 3p. The pixel separation structure 31 may have a width decreasing in a direction from the first surface 10a toward the second surface 10b.

The pixel separation structure 31 may include a separation conductive pattern 27, a separation insulating layer 21, and an insulating gapfill pattern 29. The separation conductive pattern 27 may be provided to penetrate the second epitaxial layer 5 and the first epitaxial layer 3. The separation insulating layer 21 may be interposed between the separation conductive pattern 27 and the first substrate 10. The separation insulating layer 21 may be interposed between the separation conductive pattern 27 and the single crystalline layer 1g. The insulating gapfill pattern 29 may be interposed between the first surface 10a and the separation conductive pattern 27. The separation conductive pattern 27 may be formed of or include at least one of, for example, doped polysilicon and/or metallic materials. In an embodiment, each of the separation insulating layer 21 and the insulating gapfill pattern 29 may be formed of or include silicon oxide. The pixel separation structure 31 may be in contact with the first epitaxial pattern 3p.

A device isolation pattern 17a may be provided near the first surface 10a of the substrate 10 to define active regions ACT1 and ACT2 in the unit pixel UP of each of the pixel array region APS. The device isolation pattern 17a may have a single- or multi-layered structure including at least one of, for example, silicon oxide, silicon nitride, or silicon oxynitride. The active regions ACT1 and ACT2 may include a first active region ACT1, on which a transfer gate electrode TG is disposed, and a second active region ACT2, on which a circuit gate electrode GE is disposed.

The transfer gate electrode TG may correspond to a gate of the transfer transistor TX of FIG. 2. The circuit gate electrode GE may correspond to one of a reset gate RG of the reset transistor RX, a source follower gate of the source follower transistor DX, or a selection gate of the selection transistor SX of FIG. 2. Adjacent ones of the unit pixels UP may share at least one of the reset gate RG of the reset transistor RX, the source follower gate of the source follower transistor DX, or the selection gate of the selection transistor SX, which are used to transfer charges.

A portion of the transfer gate electrode TG may be provided to penetrate the second epitaxial pattern 5p. In an embodiment, the transfer gate electrode TG may further include another portion that protrudes toward a region outside the first surface 10a and covers the first surface 10a. The transfer gate electrode TG may be a 'vertical-type gate'. The floating diffusion region FD may be disposed in a portion of the first active region ACT1, which is located near the transfer gate electrode TG. The floating diffusion region FD may be disposed in the second epitaxial pattern 5p. In an embodiment, the floating diffusion region FD may be doped to have the second conductivity type.

The circuit gate electrode GE may not be inserted into the second epitaxial pattern 5p. The circuit gate electrode GE may be placed on the first surface 10a and may be a 'planar-type gate'. Source/drain regions SD may be disposed in portions of the second active region ACT2, which are located at both sides of the circuit gate electrode GE. In an embodiment, the source/drain regions SD may be doped to have the second conductivity type. A gate insulating layer GI may be interposed between the transfer gate electrode TG and the second epitaxial pattern 5p and between the circuit gate electrode GE and the second epitaxial pattern 5p. The gate insulating layer GI may be formed of or include at least one of, for example, silicon oxide and/or silicon nitride.

An interlayer insulating layer 40 may be formed to cover the first surface 10a. The interlayer insulating layer 40 may have a multi-layered structure including at least one of silicon oxide, silicon nitride, silicon oxynitride, SiCN, TEOS, or porous insulating materials. A plurality of interconnection lines 42, which are stacked to form a multi-layered structure, may be disposed in the interlayer insulating layer 40. The interlayer insulating layer 40 may be covered with a first protection layer 44. For example, the protection layer 44 may be formed of or include silicon oxide.

The single crystalline layer 1g may extend to the first and second connection regions CNR1 and CNR2. The pixel separation structure 31 may extend to the first connection region CNR1. The single crystalline layer 1g may be covered with an anti-reflection layer 46. The single crystalline layer 1g may be in contact with the anti-reflection layer 46. In an embodiment, the anti-reflection layer 46 may be formed of or include silicon oxide. Although not shown, a planarization layer may be additionally disposed on the anti-reflection layer 46.

A light-blocking grid pattern 56g and a low-refractive pattern 64 may be disposed on the anti-reflection layer 46 in the pixel array region APS. Each of the light-blocking grid pattern 56g and the low-refractive pattern 64 may overlap the pixel separation structure 31 and may form a mesh shape, when viewed in a plan view. The light-blocking grid pattern 56g may be formed of or include at least one of metallic materials (e.g., titanium or tungsten). The anti-reflection layer 46 and the low-refractive pattern 64 may be conformally covered with a second protection layer 60. The second protection layer 60 may have a single- or multi-layered structure including at least one of silicon oxide, silicon nitride, aluminum oxide, or hafnium oxide.

The low-refractive pattern 64 may be formed of or include an organic material. The low-refractive pattern 64 may have a refractive index that is lower than color filters CF1 and CF2. For example, the low-refractive pattern 64 may have a refractive index of about 1.3 or lower. A side surface of the low-refractive pattern 64 may be aligned to a side surface of the light-blocking grid pattern 56g. The light-blocking grid pattern 56g and the low-refractive pattern 64 may prevent a cross-talk issue from occurring between adjacent ones of the unit pixels UP.

The color filters CF1 and CF2 may be disposed between the low-refractive patterns 64 in the pixel array region APS. Each of the color filters CF1 and CF2 may have one color of blue, green, and red. The color filters CF1 and CF2 may be arranged in the form of a Bayer pattern, a 2×2 Tetra pattern, or a 3×3 Nona pattern. In an embodiment, the color filters CF1 and CF2 may be provided to have other colors, such as cyan, magenta, or yellow.

A micro lens array layer ML may be disposed on the color filters CF1 and CF2 in the pixel array region APS. The micro lens array layer ML may include convex lens portions, which respectively overlap the unit pixels UP.

A first contact plug CT1 may be provided on the first connection region CNR1 to penetrate the anti-reflection layer 46, the single crystalline layer 1g, and a portion of the first epitaxial layer 3 and to be in contact with the separation conductive pattern 27 of the pixel separation structure 31. A negative bias voltage may be applied to the separation conductive pattern 27 through the first contact plug CT1. In this case, it may be possible to prevent or suppress a white spot issue or a dark current issue.

The first contact plug CT1 may be inserted in a first contact hole 48. A first contact insulating layer 54 may be interposed between the first contact plug CT1 and the anti-reflection layer 46, between the first contact plug CT1 and the single crystalline layer 1g and between the first contact plug CT1 and the first epitaxial layer 3. The first contact plug CT1 may include a first barrier pattern 56a and a first metal pattern 58a. The first barrier pattern 56a may conformally cover a side surface of the first contact insulating layer 54 and a top surface of the anti-reflection layer 46. The first barrier pattern 56a may be interposed between the separation conductive pattern 27 and the first metal pattern 58a. A bottom surface of the first contact plug CT1 may be located at a first depth DT1 from the top surface of the anti-reflection layer 46. In an embodiment, the first contact insulating layer 54 may be formed of or include silicon oxide. Although not shown, at least a portion (e.g., the first metal pattern 58a) of the first contact plug CT1 may extend to another region and may be electrically connected to a through-silicon via (TSV) or a back-vias stack (BVS).

A second contact plug CT2 may be provided on the second connection region CNR2 to penetrate the anti-reflection layer 46 and to be in contact with the single crystalline layer 1g. The second contact plug CT2 may be placed in a second contact hole 50. The second contact plug CT2 may include a second barrier pattern 56b and a second metal pattern 58b. A bottom surface of the second contact plug CT2 may be located at a second depth DT2 from the top surface of the anti-reflection layer 46. In the present embodiment, the second depth DT2 may be smaller than the first depth DT1. At least a portion (e.g., the second metal pattern 58b) of the second contact plug CT2 may extend to another region and may be electrically connected to a through-silicon via (TSV) or a back-vias stack (BVS).

The light-blocking grid pattern 56g, the first barrier pattern 56a, and the second barrier pattern 56b may be formed of or include the same metallic material (hereinafter, a first metal). The first metal may be titanium or tantalum. The first metal pattern 58a and the second metal pattern 58b may be formed of or include the same metallic material (hereinafter, a second metal). The second metal may be different from the first metal. The second metal may be formed of or include at least one of, for example, aluminum, tungsten, or copper.

The second contact plug CT2 and/or the single crystalline layer 1g may be grounded. In an embodiment, the second contact plug CT2 may be applied with a ground voltage. The ground voltage may also be applied to the single crystalline layer 1g through the second contact plug CT2.

The image sensor 500 may be a back-side light-receiving image sensor. Light may be incident into the first substrate 10 through the second surface 10b of the substrate 10. Electron-hole pairs may be generated in the PN junction by the incident light. Electrons, which are generated through this process, may be transferred to an n-type epitaxial pattern (e.g., the first epitaxial pattern 3p). If a voltage is applied to the transfer gate TG, the electrons may be transferred to the floating diffusion region FD.

The single crystalline layer 1g, which is highly doped with p-type impurities, may serve as a fixed charge layer. The single crystalline layer 1g may serve as a hole accumulation layer. At least some of holes, which are generated by incident light, may be transferred to the single crystalline layer 1g. In the second connection region CNR2, the single crystalline layer 1g may be connected to the second contact plug CT2 and the holes transferred to the single crystalline layer 1g may be discharged through the second contact plug CT2. Accordingly, in the image sensor 500, it may be possible to prevent a dark current issue or a white spot issue and to realize clear image quality. The single crystalline layer 1g may be referred to as a 'fixed charge layer', a 'hole accumulation layer', or a 'ground layer'.

The first contact plug CT1 and the second contact plug CT2 may be sequentially covered with the second protection layer 60, an optical black pattern CFB, and the micro lens array layer ML. In an embodiment, the optical black pattern CFB may be formed of or include a material that is the same as a blue color filter.

FIGS. 5A to 5G are sectional views sequentially illustrating steps in a process of fabricating an image sensor having the section of FIG. 4A.

Figure 5A:
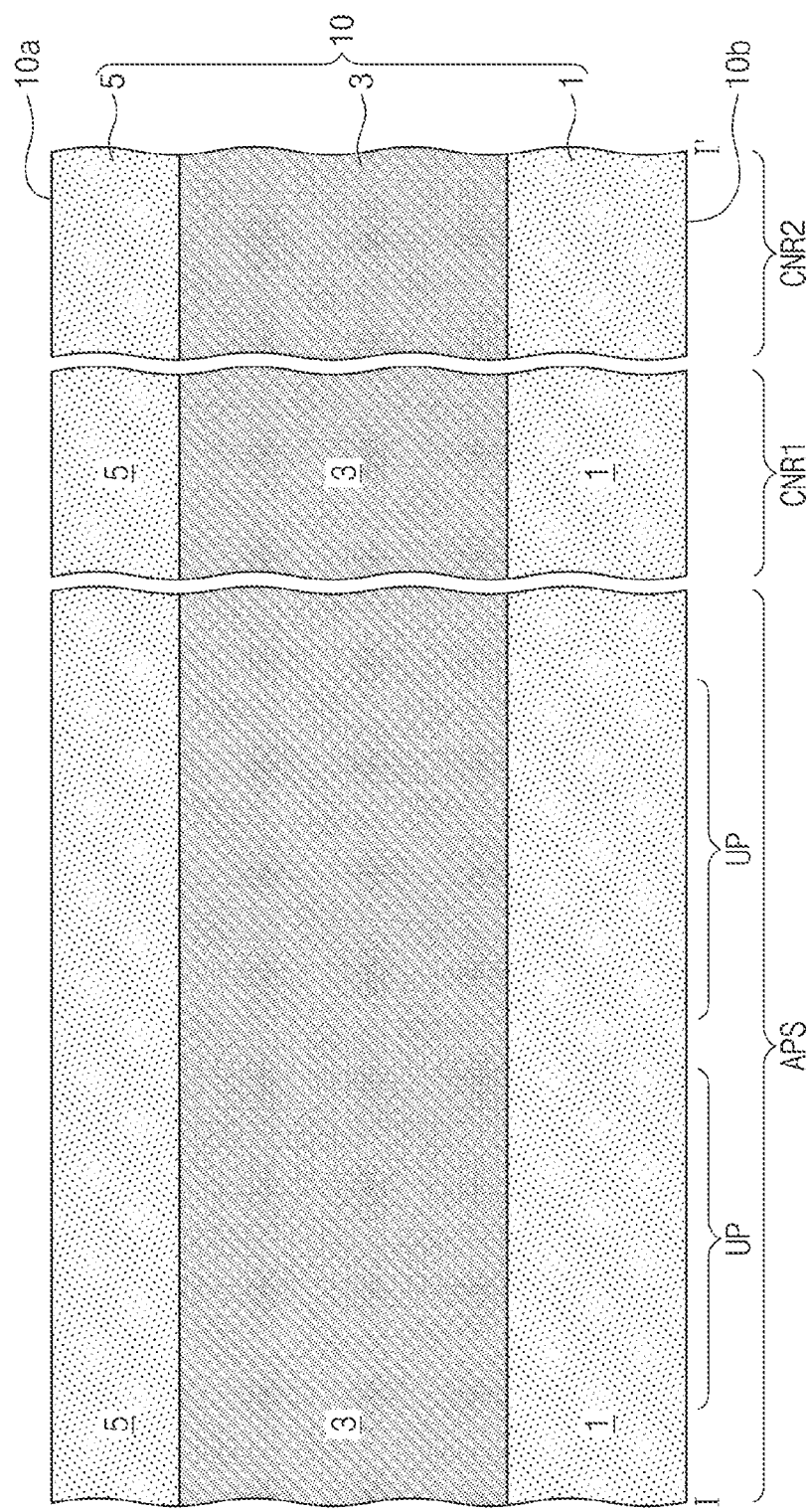
FIGS. 5A to 5G are sectional views sequentially illustrating steps in a process of fabricating an image sensor having the section of FIG. 4A.

Referring to FIG. 5A, the first epitaxial layer 3 and the second epitaxial layer 5 may be sequentially formed through a selective epitaxial growth (SEG) process performed on a single crystalline substrate 1. The single crystalline substrate 1 may be, for example, a single-crystalline silicon wafer or a silicon-on-insulator (SOI) wafer. The single crystalline substrate 1 may be highly doped with, for example, p-type impurities. The first epitaxial layer 3 may be doped with, for example, n-type impurities in an in-situ manner. The second epitaxial layer 5 may be doped with, for example, p-type impurities in an in-situ manner. Accordingly, the substrate 10 including the single crystalline substrate 1, the first epitaxial layer 3, and the second epitaxial layer 5 may be formed. The substrate 10 may include the first surface 10a and the second surface 10b, which are opposite to each other. The substrate 10 may include the pixel array region APS, the first connection region CNR1, and the second connection region CNR2. The pixel array region APS may include a plurality of the unit pixels UP.

Figure 5B:
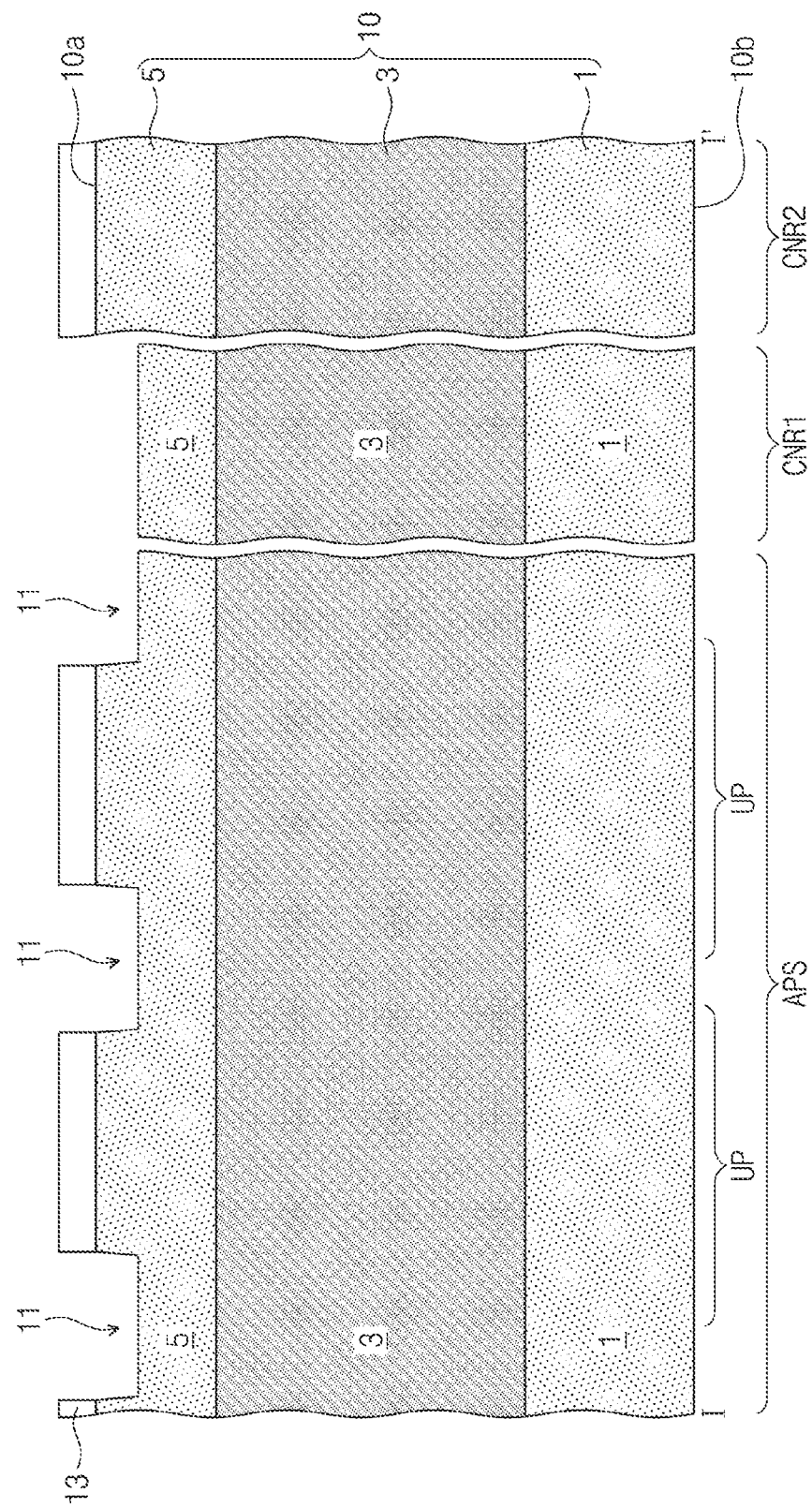

Referring to FIGS. 3 and 5B, a first mask pattern 13 may be formed on the first surface 10a of the substrate 10. The first mask pattern 13 may include openings, which are used to define shapes of the first and second active regions ACT1 and ACT2 of FIG. 3. Shallow trenches 11 may be formed in the second epitaxial layer 5 by etching the second epitaxial layer 5 using the first mask pattern 13 as an etch mask.

Figure 5C:
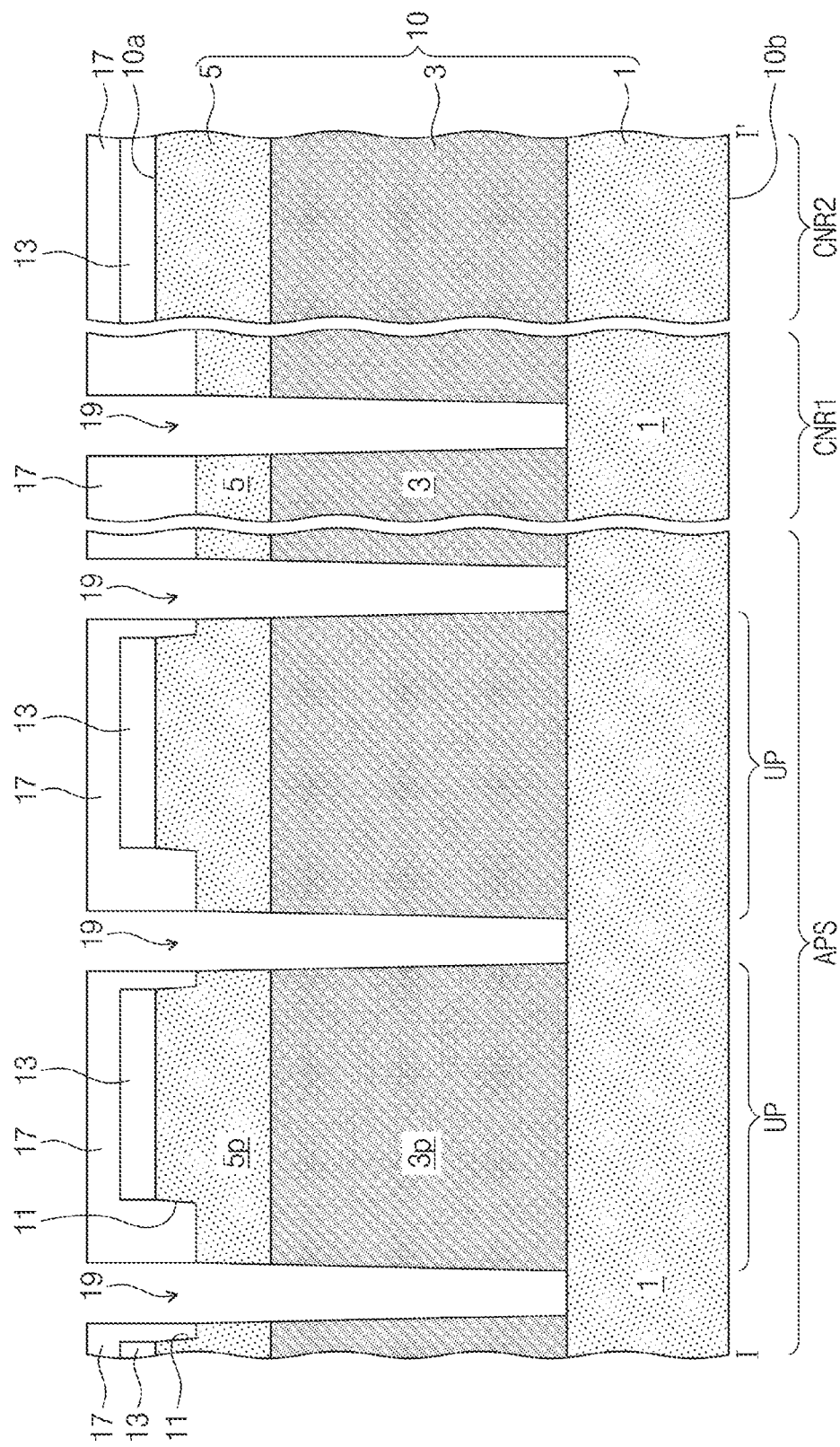

Referring to FIGS. 3, 5B, and 5C, a second mask pattern 17 may be formed on the first surface 10a of the substrate 10, in which the shallow trenches 11 are formed. The second mask pattern 17 may have an opening defining a planar shape of the pixel separation structure 31. The second mask pattern 17 may be formed of or include a material having an etch selectivity with respect to the first mask pattern 13. For example, the first mask pattern 13 may be formed of silicon nitride, and the second mask pattern 17 may be formed of or include silicon oxide. The second mask pattern 17 may be formed to cover the first mask pattern 13 and to partially expose bottom surfaces of the shallow trenches 11. A deep trench 19 exposing the single crystalline substrate 1 may be formed by sequentially etching the second and first epitaxial layers 5 and 3 of the substrate 10 using the second mask pattern 17 as an etch mask. Since the first impurities doped in the single crystalline substrate 1 is different from the second impurities doped in the first epitaxial layer 3, the single crystalline substrate 1 may have an etch selectivity with respect to the first epitaxial layer 3. Accordingly, it may be easy to form the deep trench 19 to a uniform depth in the etching process. The second epitaxial patterns 5$p$ and the first epitaxial patterns 3$p$ may be respectively formed by patterning the second epitaxial layer 5 and the first epitaxial layer 3 in the pixel array region APS through the etching process.

Figure 5D:
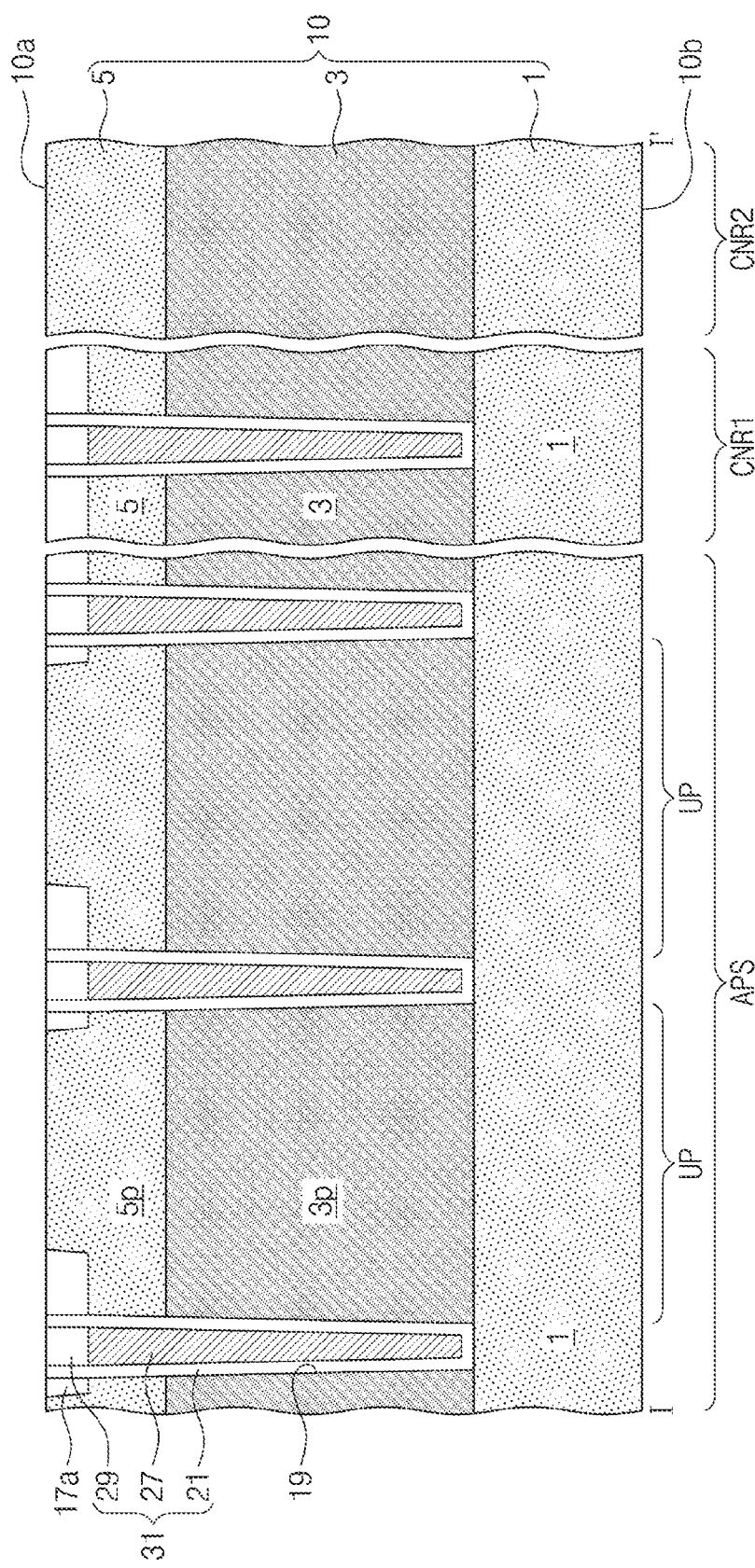

Referring to FIGS. 3, 5C, and 5D, the separation insulating layer 21 may be conformally formed on the first surface 10$a$ of the substrate 10, in which the deep trench 19 is formed, and then, a conductive layer may be formed to fill the deep trench 19. Thereafter, the conductive layer may be etched back to form the separation conductive pattern 27 in the deep trench 19. Next, an insulating gapfill layer may be formed to fill an upper region of the deep trench 19. A chemical mechanical polishing (CMP) process may be performed to remove a portion of the insulating gapfill layer, a portion of the second mask pattern 17, and the first mask pattern 13 on the first surface 10$a$ of the substrate 10 and to form the insulating gapfill pattern 29 in the upper region of the deep trench 19. In addition, the CMP process may be performed to form the device isolation pattern 17$a$, which corresponds to a portion of the second mask pattern 17, in the shallow trench 11 and to expose the first surface 10$a$.

Figure 5E:
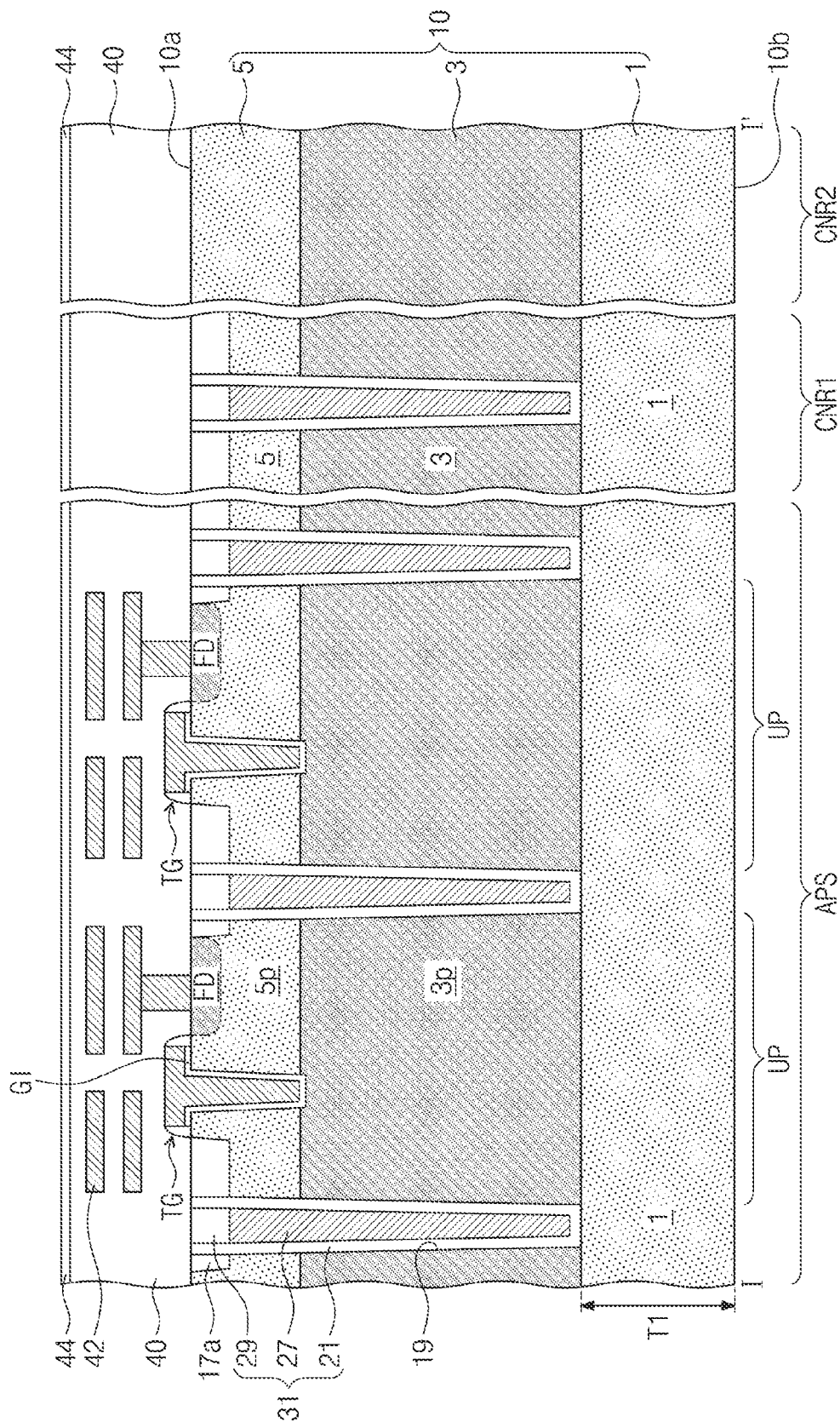

Referring to FIGS. 3 and 5E, the transfer gate electrode TG, the circuit gate electrode GE, the gate insulating layer GI, the floating diffusion region FD, the source/drain region SD, the interlayer insulating layer 40, the interconnection lines 42, and the first protection layer 44 may be formed on the first surface 10$a$ of the substrate 10 through a conventional process. The single crystalline substrate 1 may have a first thickness T1.

Figure 5F:
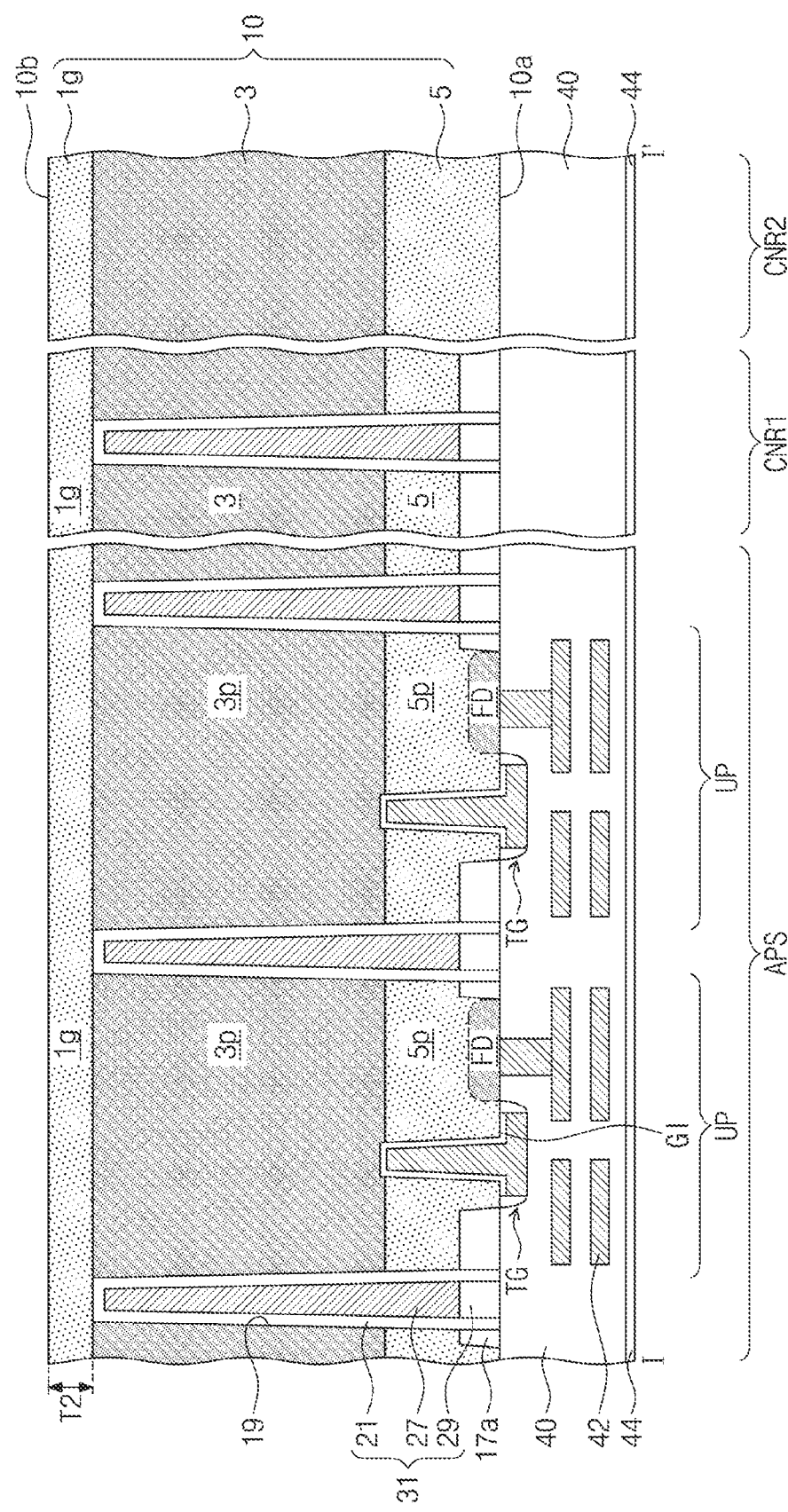

Referring to FIGS. 5E and 5F, a back-grinding process may be performed on the single crystalline substrate 1 to reduce a thickness of the single crystalline substrate 1 from the first thickness T1 to the second thickness T2. Accordingly, the single crystalline layer 1$g$ may be formed. The substrate 10 may be inverted such that the second surface 10$b$ faces upward.

Figure 5G:
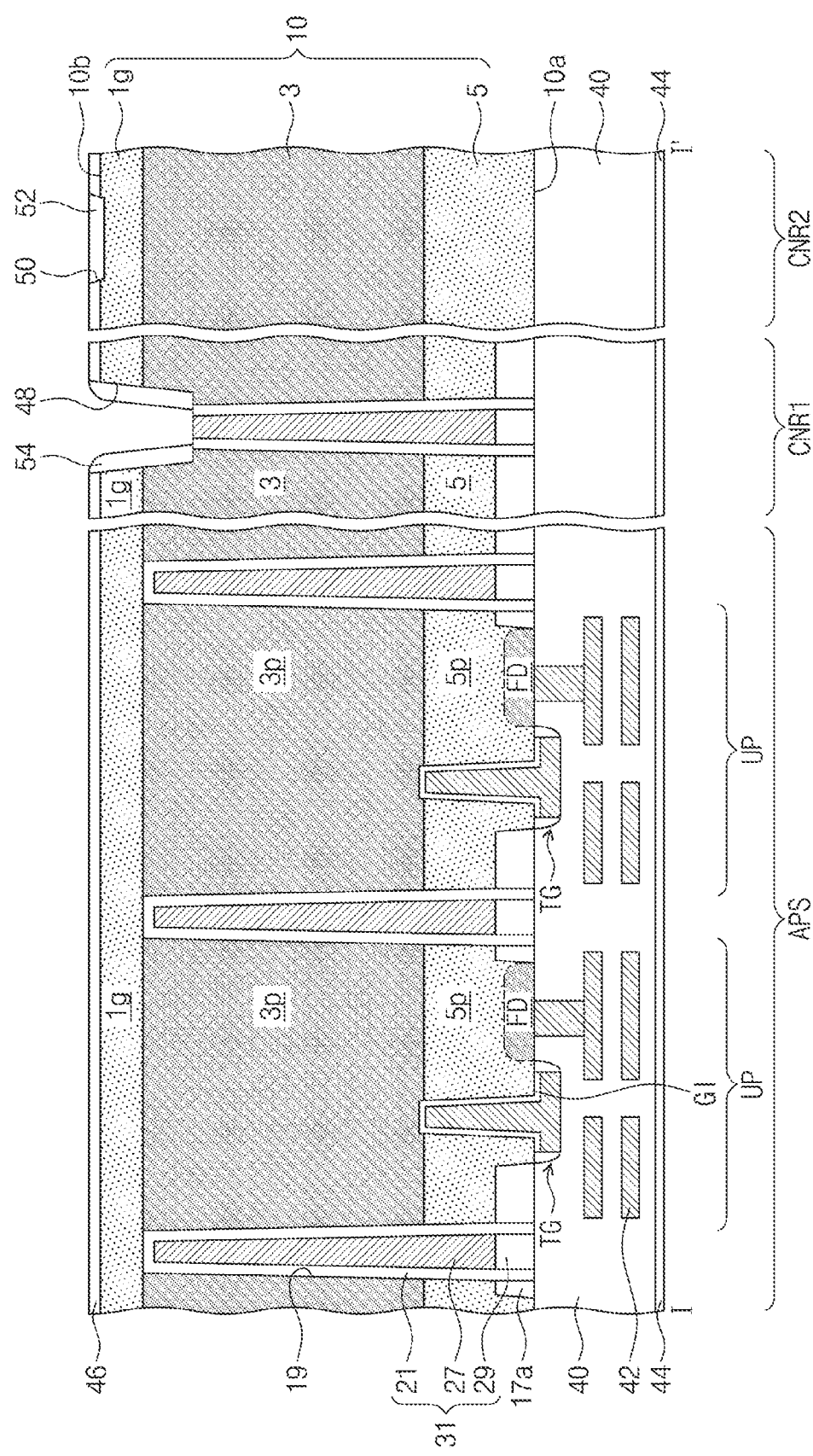

Referring to FIGS. 3, 5F, and 5G, the anti-reflection layer 46 may be formed on the second surface 10$b$ of the substrate 10. The anti-reflection layer 46, the single crystalline layer 1$g$, the separation insulating layer 21, and the first epitaxial layer 3 in the first connection region CNR1 may be etched to form the first contact hole 48 exposing the separation conductive pattern 27. The anti-reflection layer 46 in the second connection region CNR2 may be etched to form the second contact hole 50 exposing the single crystalline layer 1$g$. A sacrificial pattern 52 may be formed to fill the second contact hole 50. Thereafter, a contact insulating layer 54 may be formed to cover an inner sidewall of the first contact hole 48. Here, a thickness of the contact insulating layer 54 may be adjusted such that the first epitaxial layer 3 near a bottom of the first contact hole 48 is not exposed. The contact insulating layer 54 may be in contact with a portion of the separation insulating layer 21.

Referring back to FIGS. 3 and 4A, a barrier layer may be conformally formed to fully cover the second surface 10$b$ of the substrate 10. A metal layer may be formed on the barrier layer. The metal and barrier layers on the first and second connection regions CNR1 and CNR2 may be etched to form the first contact plug CT1 including the first barrier pattern 56$a$ and the first metal pattern 58$a$ and the second contact plug CT2 including the second barrier pattern 56$b$ and the second metal pattern 58$b$. A low refractive layer may be formed on the barrier layer in the pixel array region APS, and the low refractive layer and the barrier layer may be sequentially etched to form the low-refractive pattern 64 and the light-blocking grid pattern 56$g$. The light-blocking grid pattern 56$g$ may be a portion of the barrier layer left after the etching.

The second protection layer 60 may be conformally formed to fully cover the second surface 10$b$ of the first substrate 10. The color filters CF1 and CF2 and the optical black pattern CFB may be formed through a convention process. The optical black pattern CFB may be formed when a blue color filter is formed. Next, the micro lens array layer ML may be formed on the color filters CF1 and CF2 and the optical black pattern CFB. Accordingly, the image sensor 500 may be fabricated to have the structure of FIG. 4A.

According to a conventional method, a photoelectric conversion part may be formed by performing an ion implantation process several times, and in the case where a projection depth in the ion implantation process is increased, a process difficulty and cost of an apparatus, which are required for the ion implantation process, are increased. In addition, according to the conventional method, it may be hard to form a uniformly-doped photoelectric conversion part throughout a deep or thick region. By contrast, in the method of fabricating an image sensor according to an embodiment of the disclosure, the first epitaxial layer 3 or 3$p$, which is used as a photoelectric conversion part, may be formed by a selective epitaxial growth (SEG) process and an in-situ doping process. Accordingly, a process difficulty may be lowered, and an expensive apparatus for an ion implantation process may not be needed. In addition, the first epitaxial layer 3 or 3$p$, which is used as the photoelectric conversion part, may be formed to have a uniform doping concentration throughout a deep or thick region, and thus, it may be possible to realize an image sensor having an increased full well capacity (FWC) and an improved image quality.

Figure 6:
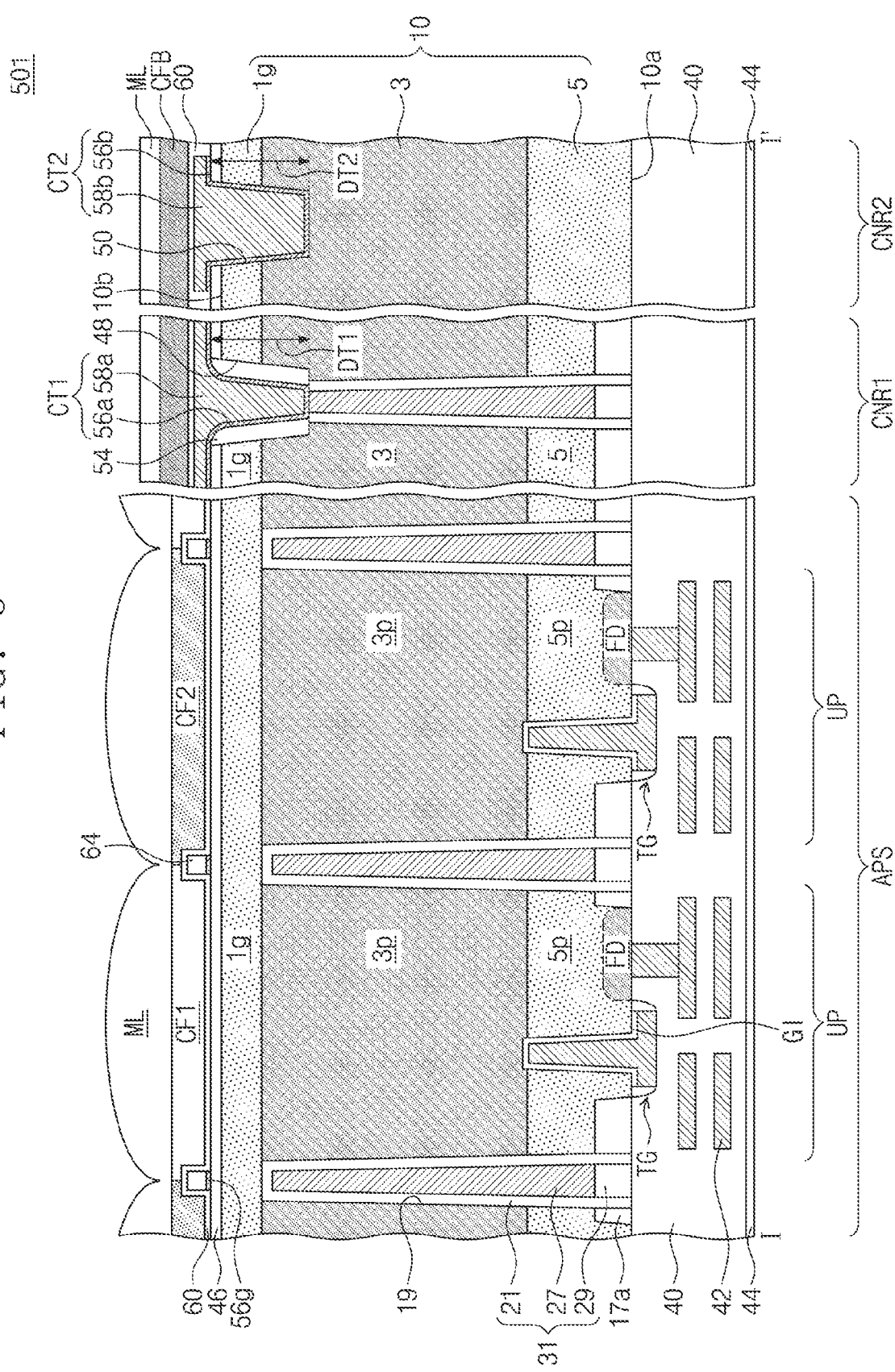
FIG. 6 is a sectional view taken along the line I-I' of FIG. 3.

FIG. 6 is a sectional view taken along the line I-I' of FIG. 3.

Referring to FIG. 6, in an image sensor 501 according to the present embodiment, the second contact plug CT2 may be provided to penetrate the single crystalline layer 1$g$ and to be inserted in the first epitaxial layer 3. In the present embodiment, a second depth DT2 from the top surface of the anti-reflection layer 46 to the bottom surface of the second contact plug CT2 may be equal or similar to a first depth DT1 to the bottom surface of the first contact plug CT1. Except for these differences, the image sensor according to the present embodiment may be configured to have the same or similar features as those in the previous embodiments.

In a method of fabricating the image sensor 501, the first and second contact holes 48 and 50, in which the first and second contact plugs CT1 and CT2 are respectively inserted, may be formed at the same time, in the step illustrated in FIG. 5G. Except for the afore-described differences, other parts of the fabrication process according to the present embodiment may be performed in the same or similar manner as that in the previous embodiment.

Figure 7:
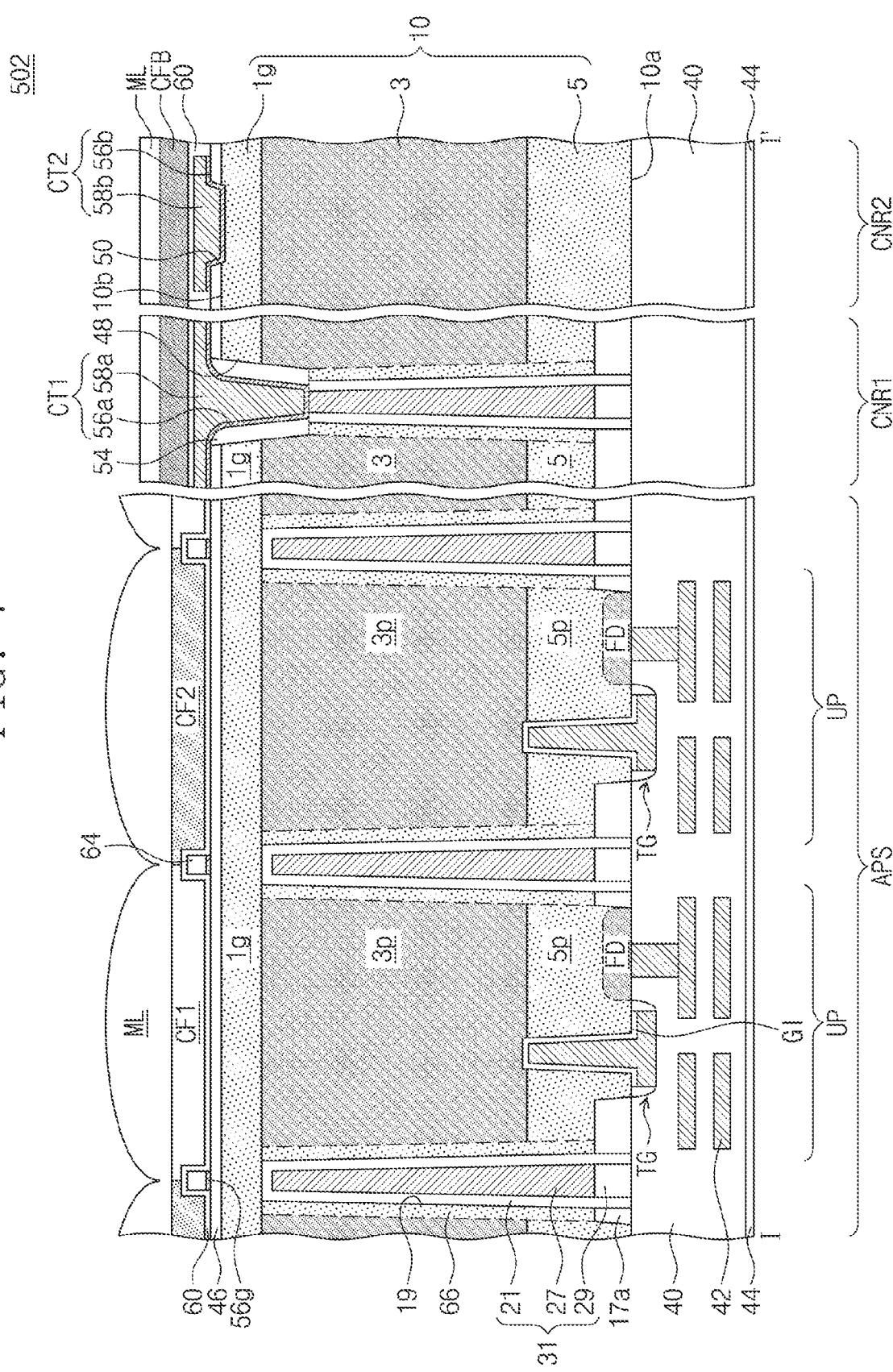
FIG. 7 is a sectional view taken along the line I-I' of FIG. 3.

FIG. 7 is a sectional view taken along the line I-I' of FIG. 3.

Referring to FIG. 7, in an image sensor 502 according to the present embodiment, an impurity injection region 66 may be disposed in a portion of the first epitaxial layer 3 or 3p adjacent to an inner sidewall of the deep trench 19. The impurity injection region 66 may be doped with the first impurities, which are of the first conductivity type or are of the same kind as impurities doped in the single crystalline layer 1g and the second epitaxial layer 5 or 5p. Here, a doping concentration of the first impurities in the impurity injection region 66 may be higher than a doping concentration of the first impurities in the second epitaxial layer 5 or 5p. The impurity injection region 66 may prevent electrons, which are trapped by dangling bonds on the sidewall of the deep trench 19, from being moved to the first epitaxial pattern 3p corresponding to the photoelectric conversion part, and this may make it possible to prevent or suppress a dark current or white spot phenomenon from occurring in the image sensor 502. The contact insulating layer 54 may be provided on the first connection region CNR1 to be in contact with the impurity injection region 66. Except for these differences, the image sensor according to the present embodiment may be configured to have the same or similar features as those in the previous embodiments.

In a method of fabricating the image sensor 502, a slanted ion implantation process or a plasma-assisted doping (PLAD) process may be performed in the step illustrated in FIG. 5C to slantingly inject the first impurities into the first epitaxial layer 3 or 3p through the deep trench 19 and to form the impurity injection region 66. Except for the afore-described differences, other parts of the fabrication process according to the present embodiment may be performed in the same or similar manner as that in the previous embodiment.

Figure 8:
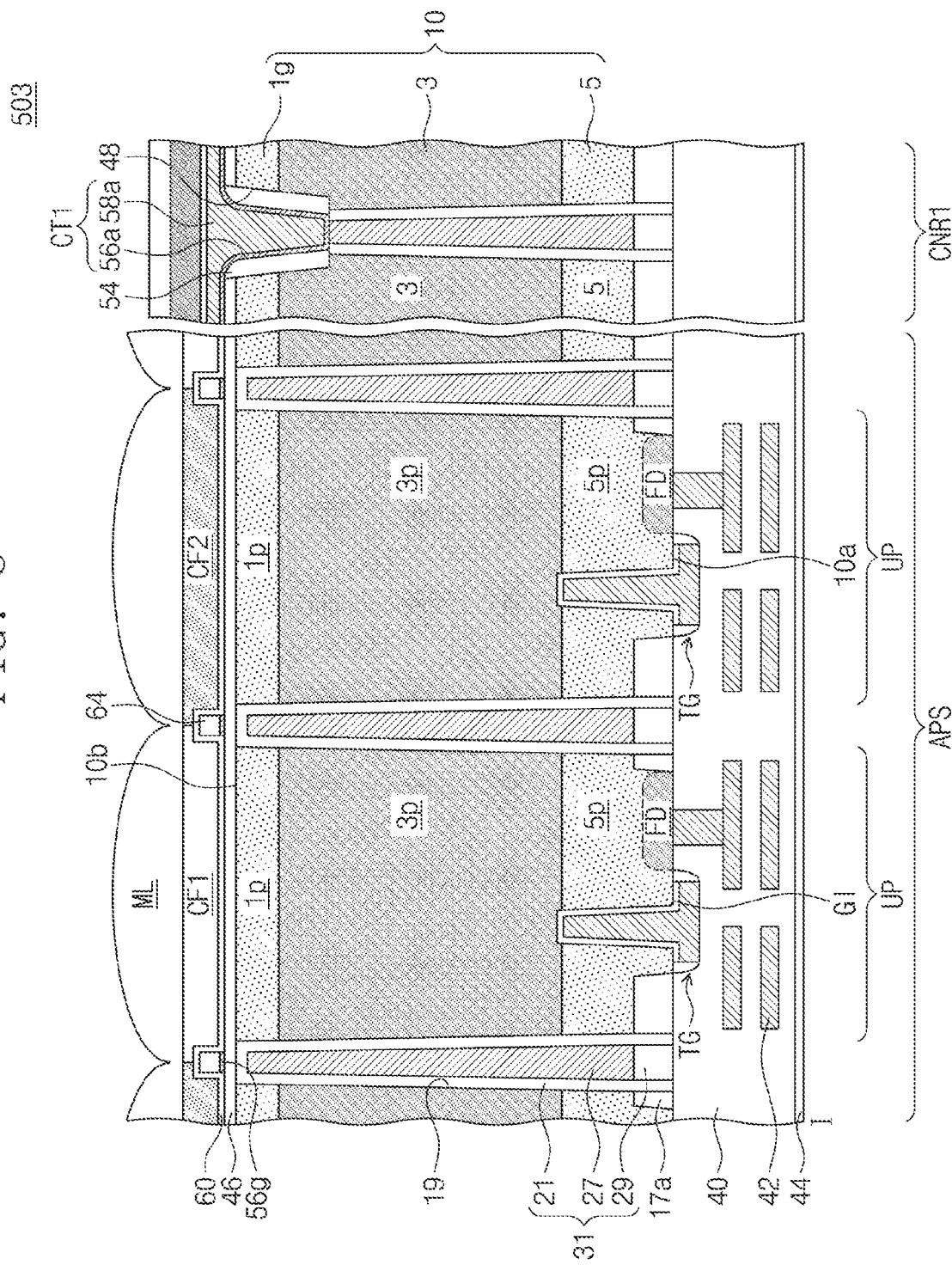
FIG. 8 is a sectional view illustrating an image sensor according to an embodiment of the disclosure.

FIG. 8 is a sectional view illustrating an image sensor according to an embodiment of the disclosure. The second connection region of FIG. 4A is not illustrated in FIG. 8.

Referring to FIG. 8, in an image sensor 503 according to the present embodiment, the pixel separation structure 31 may be provided to have a structure penetrating the single crystalline layer 1g of FIG. 4A. Accordingly, the single crystalline layer 1g may be divided into single crystalline patterns 1p, which are respectively placed in the unit pixels UP, by the pixel separation structure 31. The single crystalline pattern 1p may be highly doped with the first impurities of the first conductivity type, like the single crystalline layer 1g. For example, the single crystalline pattern 1p may be a silicon single crystalline pattern doped with p-type impurities. The single crystalline pattern 1p may have the same thickness as the single crystalline layer 1g of FIG. 4A (i.e., the second thickness T2). The single crystalline pattern 1p may be referred to as a 'single crystalline layer'. The separation insulating layer 21 of the pixel separation structure 31 may be in contact with the anti-reflection layer 46. In the present embodiment, the single crystalline pattern 1p may serve as a 'negative fixed charge layer'. In the present embodiment, the second contact plug CT2 may not be connected to the single crystalline pattern 1p, unlike the single crystalline layer 1g of FIG. 4A. Except for these differences, other portions of the image sensor may be configured to have the same or similar features as those in the previous embodiments.

In the fabrication process of the image sensor 503 of FIG. 8, the step of FIG. 5C may be performed to etch a portion of the single crystalline layer 1g and to more deeply form the deep trench 19. Thereafter, a subsequent process may be performed such that a portion of the pixel separation structure 31 is placed in the single crystalline layer 1g. Next, the back-grinding process of FIG. 5F may be performed to expose the separation insulating layer 21 of the pixel separation structure 31. Except for the afore-described differences, other parts of the fabrication process according to the present embodiment may be performed in the same or similar manner as that in the previous embodiment.

Figure 9:
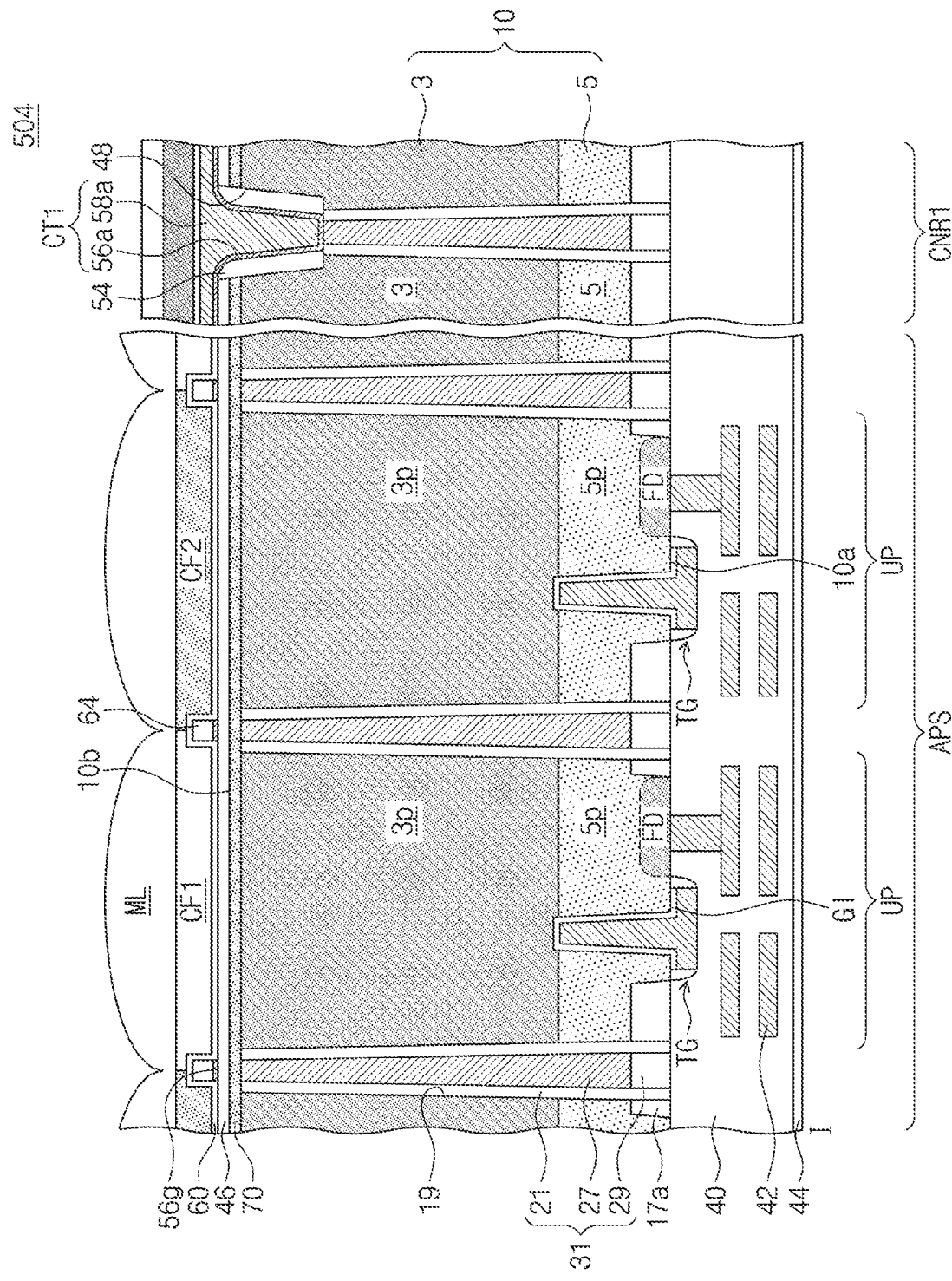
FIG. 9 is a sectional view illustrating an image sensor according to an embodiment of the disclosure.

FIG. 9 is a sectional view illustrating an image sensor according to an embodiment of the disclosure. The second connection region of FIG. 4A is not illustrated in FIG. 9.

Referring to FIG. 9, in an image sensor 504 according to the present embodiment, the substrate 10 may be provided to include the first epitaxial layer 3 and the second epitaxial layer 5 but not the single crystalline layer 1g of FIG. 4A. The first surface 10a of the substrate 10 may correspond to a bottom surface of the second epitaxial layer 5, and the second surface 10b of the substrate 10 may correspond to a top surface of the first epitaxial layer 3. The second surface 10b of the substrate 10 may be covered with a fixed charge layer 70. The fixed charge layer 70 may be in contact with the first epitaxial layer 3.

The fixed charge layer 70 may include a metal oxide layer whose oxygen content is lower than its stoichiometric ratio or a metal fluoride layer whose fluorine content ratio is lower than its stoichiometric ratio and may have a single or multi-layered structure. Accordingly, the fixed charge layer 70 may have a negative fixed charge. The fixed charge layer 70 may be formed of at least one of metal oxides or metal fluorides containing at least one metallic element that is selected from the group consisting of hafnium (Hf), zirconium (Zr), aluminum (Al), tantalum (Ta), titanium (Ti), yttrium (Y), and lanthanoid and may have a single or multi-layered structure. For example, the fixed charge layer 70 may include a hafnium oxide layer and/or an aluminum oxide layer. Due to the fixed charge layer 70, it may be possible to prevent or suppress a dark current issue or a white spot issue from occurring in the image sensor.

The anti-reflection layer 46 may be disposed on the fixed charge layer 70. The separation conductive pattern 27 of the pixel separation structure 31 may be in contact with the fixed charge layer 70. The first contact plug CT1 and the contact insulating layer 54 may be provided to penetrate the anti-reflection layer 46, the fixed charge layer 70, and a portion of the first epitaxial layer 3 in a first connection region CNR1.

The image sensor 504 of FIG. 9 may be fabricated by removing the single crystalline layer 1g and a portion of the separation insulating layer 21 to expose the first epitaxial layer 3 or 3p, in the back-grinding process of FIG. 5F, and then, performing a subsequent process.

Figure 10:
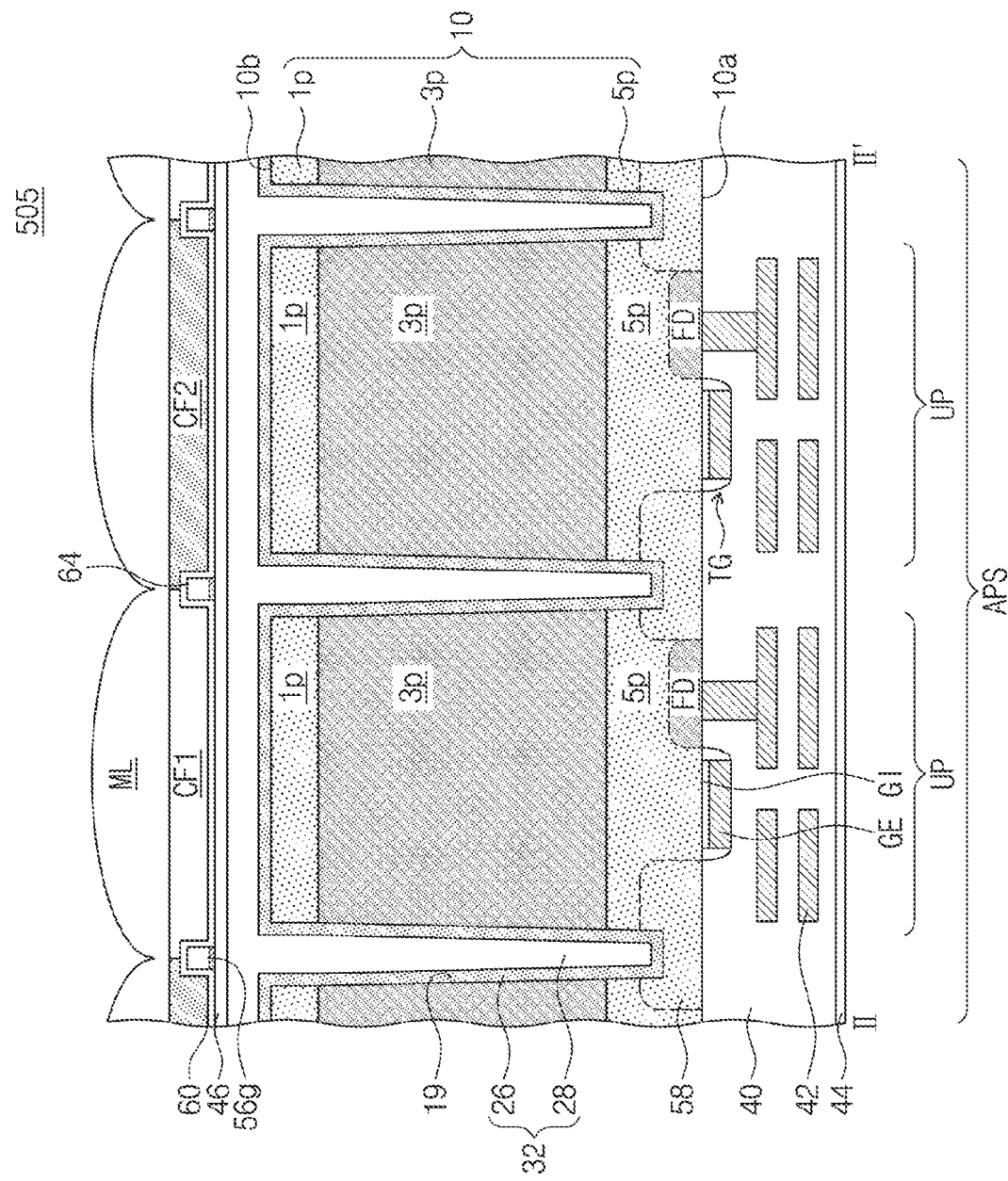
FIG. 10 is a sectional view illustrating an image sensor according to an embodiment of the disclosure.

FIG. 10 is a sectional view illustrating an image sensor according to an embodiment of the disclosure. The first and second connection regions of FIG. 4A are not illustrated in FIG. 10.

Referring to FIG. 10, an image sensor 505 according to the present embodiment may include a device isolation region 58, which is formed in a portion of the second epitaxial layer 5p near the first surface 10a. In an embodiment, the device isolation region 58 may be an impurity region, which is doped with the same impurities (i.e., the first impurities) as the second epitaxial layer 5p and has a doping concentration higher than the second epitaxial layer 5p. The device isolation region 58 may be used to define or delimit the active regions ACT1 and ACT2 of FIG. 3, like the device isolation pattern 17a of FIG. 4A.

The deep trench 19 may be formed to extend from the second surface 10b of the substrate 10 toward the first surface 10a. A bottom surface of the deep trench 19 may be placed in the device isolation region 58. An inner side surface and a bottom surface of the deep trench 19 and the second surface 10b may be conformally covered with a first separation insulating layer 26. A second separation insulating layer 28 may be disposed on the first separation insulating layer 26 to fill the deep trench 19. The second separation insulating layer 28 may be horizontally extending to cover the second surface 10b. The first separation insulating layer 26 may be formed of or include at least one of, for example, hafnium oxide and/or aluminum oxide. The second separation insulating layer 28 may be formed of or include, for example, silicon oxide.

The first separation insulating layer 26 and the second separation insulating layer 28, which are disposed in the deep trench 19, may constitute a pixel separation structure 32. The pixel separation structure 32 may have a mesh shape that is the same as or similar to the pixel separation structure 31 described with reference to FIG. 3, when viewed in a plan view. The pixel separation structure 32 may have a width decreasing in a direction from the second surface 10b toward the first surface 10a. The pixel separation structure 32 may be provided to penetrate the single crystalline pattern 1p, the first epitaxial layer 3p, and a portion of the second epitaxial layer 5p. The anti-reflection layer 46 may be disposed on the second surface 10b to cover the second separation insulating layer 28. Except for these differences, other portions of the image sensor may be configured to have the same or similar features as those in the previous embodiments.

Figure 11:
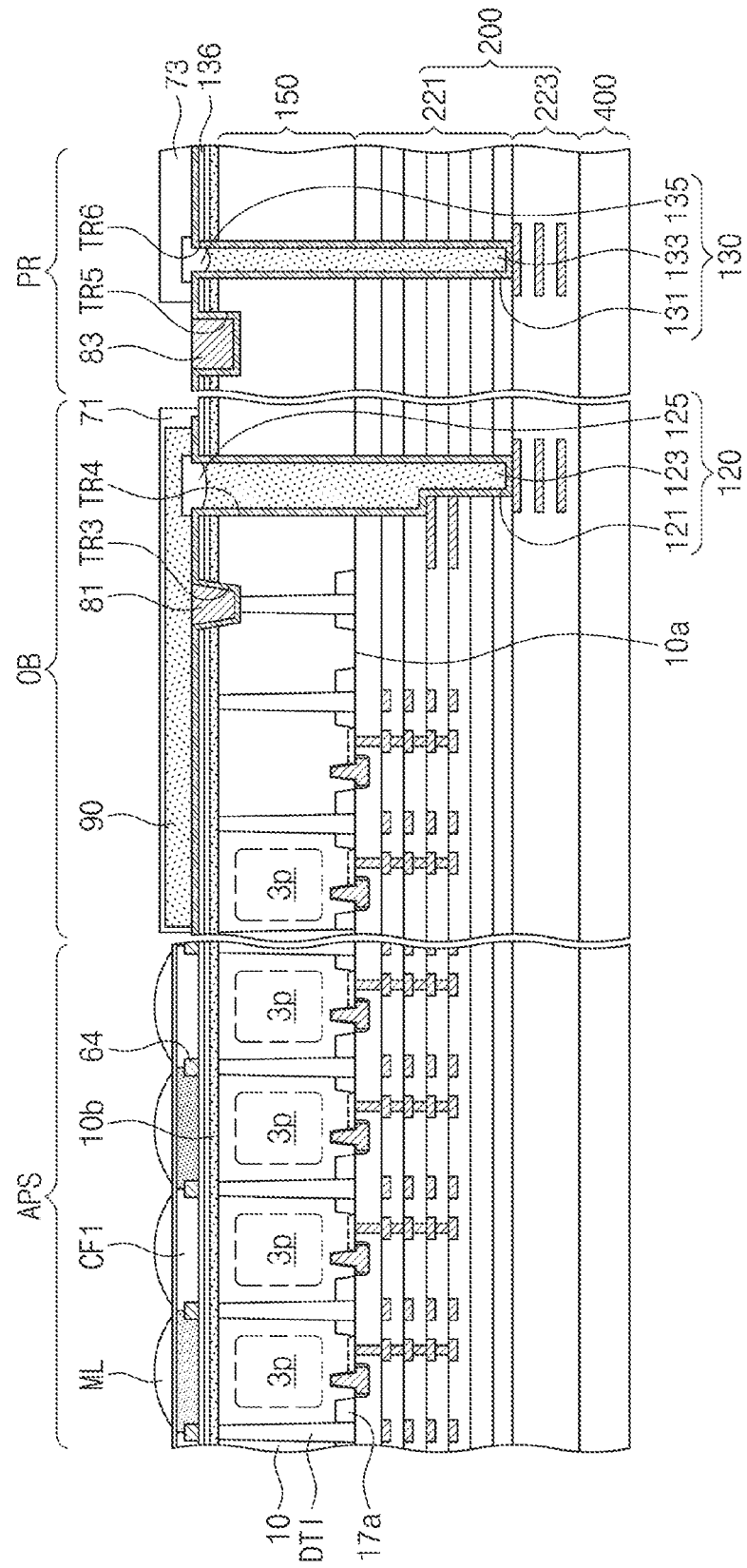
FIG. 11 is a sectional view illustrating an image sensor according to an embodiment of the disclosure.

FIG. 11 is a sectional view illustrating an image sensor according to an embodiment of the disclosure.

Referring to FIG. 11, an image sensor according to an embodiment of the disclosure may include: (1) the substrate 10 having the pixel array region APS, an optical black region OB, and a pad region PR; (2) an interconnection layer 200 on the first surface 10a of the substrate 10; and (3) a base substrate 400 on the interconnection layer 200. The substrate 10 may include the single crystalline layer 1g, the first epitaxial layer 3, and the second epitaxial layer 5 which are sequentially stacked, as described with reference to FIG. 4A.

The interconnection layer 200 may include an upper interconnection layer 221 and a lower interconnection layer 223. The pixel array region APS may include a plurality of the unit pixels UP. The unit pixels UP disposed in the pixel array region APS may be substantially the same as those previously described with reference to FIGS. 1 to 10. The first and second connection regions CNR1 and CNR2 of FIGS. 3 and 4A may be disposed in at least one of the optical black region OB and the pad region PR.

A first connection structure 120, a first conductive pad 81, and a bulk color filter 90 may be provided on the optical black region OB of the substrate 10. The first connection structure 120 may include a first light-blocking pattern 121, an insulating pattern 123, and a first capping pattern 125.

The first light-blocking pattern 121 may be provided on the second surface 10b of the substrate 10. More specifically, the first light-blocking pattern 121 may cover an insulating layer 136 on the second surface 10b and may conformally cover inner surfaces of a third trench TR3 and a fourth trench TR4. The first light-blocking pattern 121 may be provided to penetrate a photoelectric conversion layer 150 and the upper interconnection layer 221 and to connect the photoelectric conversion layer 150 to the interconnection layer 200. A pixel separation structure DTI may have substantially the same structure as the pixel separation structure 31 of FIG. 4A or the pixel separation structure 32 of FIG. 10.

More specifically, the first light-blocking pattern 121 may be in contact with interconnection lines in the upper and lower interconnection layers 221 and 223 and the separation conductive pattern 27 of the pixel separation structure DTI in the photoelectric conversion layer 150. Accordingly, the first connection structure 120 may be electrically connected to interconnection lines in the interconnection layer 200. The first light-blocking pattern 121 may be formed of or include at least one of metallic materials (e.g., tungsten). The first light-blocking pattern 121 may prevent light from being incident into the optical black region OB.

The first conductive pad 81 may be provided in the third trench TR3 to fill a remaining portion of the third trench TR3. The first conductive pad 81 may be formed of or include at least one of metallic materials (e.g., aluminum). The first conductive pad 81 may be connected to the separation conductive pattern 27 of FIG. 4A. The first conductive pad 81 may be used to apply a negative bias voltage to the separation conductive pattern 27. In this case, it may be possible to prevent or suppress a white spot issue or a dark current issue.

The insulating pattern 123 may fill a remaining portion of the fourth trench TR4. The insulating pattern 123 may be provided to penetrate the photoelectric conversion layer 150 and a portion or the entire portion of the interconnection layer 200. The first capping pattern 125 may be provided on a top surface of the insulating pattern 123. The first capping pattern 125 may be provided on the insulating pattern 123.

The bulk color filter 90 may be provided on the first conductive pad 81, the first light-blocking pattern 121, and the first capping pattern 125. The bulk color filter 90 may cover the first conductive pad 81, the first light-blocking pattern 121, and the first capping pattern 125. A first protection layer 71 may be provided on the bulk color filter 90 to hermetically seal the bulk color filter 90.

An electrical signal, which is obtained through the optical black region OB when light is blocked, may be used as a reference value for comparison with electrical signals obtained from light incident into the unit pixels UP.

A second connection structure 130, a second conductive pad 83, and a second protection layer 73 may be provided on the pad region PR of the substrate 10. The second connection structure 130 may include a second light-blocking pattern 131, an insulating pattern 133, and a second capping pattern 135.

The second light-blocking pattern 131 may be provided on the second surface 10b of the substrate 10. More specifically, the second light-blocking pattern 131 may cover the insulating layer 136 on the second surface 10b and may conformally cover inner surfaces of a fifth trench TR5 and a sixth trench TR6. The second light-blocking pattern 131 may be provided to penetrate the photoelectric conversion layer 150 and the upper interconnection layer 221 and to connect the photoelectric conversion layer 150 to the interconnection layer 200. More specifically, the second light-blocking pattern 131 may be in contact with the interconnection lines in the lower interconnection layer 223. Accordingly, the second connection structure 130 may be electrically connected to the interconnection lines in the interconnection layer 200. The second light-blocking pattern 131 may be formed of or include at least one of metallic materials (e.g., tungsten).

The second conductive pad 83 may be provided in the fifth trench TR5 to fill a remaining portion of the fifth trench TR5. The second conductive pad 83 may be formed of or include at least one of metallic materials (e.g., aluminum). The second conductive pad 83 may be used as a conduction path for an electric connection to the outside of the image sensor. The insulating pattern 133 may fill a remaining portion of the sixth trench TR6. The insulating pattern 133 may be provided to penetrate the photoelectric conversion layer 150 and a portion or the entire portion of the interconnection layer 200. The second capping pattern 135 may be provided on the insulating pattern 133. The second protection layer 73 may be provided to cover a portion of the second light-blocking pattern 131 and the second capping pattern 135.

In an image sensor according to an embodiment of the disclosure, a first epitaxial layer, which is used as a photoelectric conversion part, may be formed by a selective epitaxial growth process and an in-situ doping process. Accordingly, a process difficulty may be lowered and an expensive apparatus for an ion implantation process may not be needed. In addition, the first epitaxial layer, which is used as the photoelectric conversion part, may be formed to have a uniform doping concentration throughout a deep or thick region, and thus, it may be possible to realize an image sensor having an increased full well capacity (FWC) and an improved image quality.

Furthermore, in the image sensor according to an embodiment of the disclosure, a single crystalline layer, which is highly doped with p-type impurities, may be used as a fixed charge layer, a hole accumulation layer, or a ground layer, and thus, it may be possible to realize an improved image quality.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While example embodiments of the disclosure have been particularly shown and described, it will be understood by one of ordinary skill in the art that variations in form and detail may be made therein without departing from the spirit and scope of the attached claims.

What is claimed is:

1. An image sensor comprising:
a substrate including a first surface and a second surface that are opposite to each other, the substrate comprising a single crystalline layer, a first epitaxial layer, and a second epitaxial layer that are sequentially stacked from the second surface, the single crystalline layer and the second epitaxial layer being doped with first impurities of a first conductivity type, the first epitaxial layer being doped with second impurities of a second conductivity type, the second conductivity type being opposite to the first conductivity type;
a pixel separation structure extending from the first surface to penetrate at least the second epitaxial layer and the first epitaxial layer and to divide the substrate into a plurality of pixels; and
a transfer gate electrode extending from the first surface to penetrate the second epitaxial layer, wherein
a first concentration of the first impurities doped in the single crystalline layer is higher than a second concentration of the first impurities doped in the second epitaxial layer.

2. The image sensor of claim 1, wherein the single crystalline layer has a thickness of 100 Å-1000 Å.

3. The image sensor of claim 1, wherein the first concentration is 10 to 10,000 times the second concentration.

4. The image sensor of claim 1, wherein:
the substrate comprises a pixel array region and a connection region, the plurality of pixels being disposed in the pixel array region, the connection region being spaced apart from the pixel array region,
the single crystalline layer covers a top surface of the pixel separation structure and extends to the connection region, and
the image sensor further comprises a contact plug that is in contact with the single crystalline layer on the connection region.

5. The image sensor of claim 1, wherein:
the pixel separation structure comprises:
a separation conductive pattern penetrating the second epitaxial layer and the first epitaxial layer; and
a separation insulating layer interposed between the separation conductive pattern and the second epitaxial layer and between the separation conductive pattern and the first epitaxial layer, and
the separation insulating layer is interposed between the separation conductive pattern and the single crystalline layer.

6. The image sensor of claim 5, wherein:
the substrate comprises a pixel array region and a connection region, the plurality of pixels being disposed in the pixel array region, the connection region being spaced apart from the pixel array region, and
the image sensor further comprises:
a first contact plug penetrating the single crystalline layer and the separation insulating layer to be in contact with the separation conductive pattern on the connection region; and
a contact insulating layer interposed between the first contact plug and the single crystalline layer.

7. The image sensor of claim 6, further comprising:
a second contact plug that is spaced apart from the first contact plug and is in contact with the single crystalline layer on the connection region, wherein
a depth of a bottom surface of the first contact plug is equal to or greater than a depth of a bottom surface of the second contact plug.

8. The image sensor of claim 1, further comprising:
an anti-reflection layer covering the second surface of the substrate, wherein
the pixel separation structure penetrates the single crystalline layer to be in contact with the anti-reflection layer.

9. The image sensor of claim 1, further comprising:
a circuit gate electrode that is disposed on the first surface and is spaced apart from the transfer gate electrode, wherein:
the circuit gate electrode corresponds to a reset gate, a source follower gate, or a selection gate, and
the circuit gate electrode overlaps the single crystalline layer, the first epitaxial layer, and the second epitaxial layer.

10. An image sensor comprising:
a substrate including a first surface and a second surface that are opposite to each other, the substrate comprising a single crystalline layer, a first epitaxial layer, and a second epitaxial layer that are sequentially stacked from the second surface, the single crystalline layer and the second epitaxial layer being doped with first impurities of a first conductivity type, the first epitaxial layer being doped with second impurities of a second conductivity type, the second conductivity type opposite to the first conductivity type;
a pixel separation structure extending from the first surface to penetrate at least the second epitaxial layer and the first epitaxial layer and to divide the substrate into a plurality of pixels, the pixel separation structure comprising a separation conductive pattern penetrating the second epitaxial layer and the first epitaxial layer and a separation insulating layer interposed between the separation conductive pattern and the substrate;
a transfer gate electrode extending from the first surface to penetrate the second epitaxial layer;
a floating diffusion region disposed in a portion of the second epitaxial layer at a side of the transfer gate electrode;
an interlayer insulating layer covering the first surface;
an anti-reflection layer covering the second surface;
a color filter on the anti-reflection layer; and
a micro lens layer on the color filter, wherein:
the single crystalline layer has a thickness of 100 Å-1000 Å, and
the separation insulating layer is interposed between the single crystalline layer and the separation conductive pattern.

11. The image sensor of claim 10, wherein a first concentration of the first impurities doped in the single crystalline layer is higher than a second concentration of the first impurities doped in the second epitaxial layer.

12. The image sensor of claim 11, wherein the first concentration is 10 to 10,000 times the second concentration.

13. The image sensor of claim 10, wherein:
the substrate comprises a pixel array region and a connection region, the plurality of pixels being disposed in the pixel array region, the connection region being spaced apart from the pixel array region,
the single crystalline layer extends to the connection region, and
the image sensor further comprises a first contact plug that is provided on the connection region and is in contact with the single crystalline layer.

14. The image sensor of claim 13, wherein:
the pixel separation structure extends to the connection region, and
the image sensor further comprises:
a second contact plug penetrating the single crystalline layer and the separation insulating layer to be in contact with the separation conductive pattern on the connection region; and
a contact insulating layer interposed between the second contact plug and the single crystalline layer.

15. The image sensor of claim 14, wherein a depth of a bottom surface of the second contact plug is equal to or greater than a depth of a bottom surface of the first contact plug.

16. The image sensor of claim 10, wherein the pixel separation structure penetrates the single crystalline layer to be in contact with the anti-reflection layer.

17. An image sensor comprising:
a substrate including a first surface and a second surface that are opposite to each other, the substrate comprising a pixel array region and a connection region, the substrate comprising a first epitaxial layer and a second epitaxial layer sequentially stacked from the second surface, the second epitaxial layer being doped with first impurities of a first conductivity type, the first epitaxial layer being doped with second impurities of a second conductivity type, the second conductivity type opposite to the first conductivity type;
a pixel separation structure that extends from the first surface to penetrate at least the second epitaxial layer and the first epitaxial layer and to divide the pixel array region of the substrate into a plurality of pixels and extends to the connection region, the pixel separation structure comprising a separation conductive pattern penetrating the second epitaxial layer and the first epitaxial layer and a separation insulating layer interposed between the separation conductive pattern and the substrate;
a transfer gate electrode extending from the first surface to penetrate the second epitaxial layer;
a contact plug provided on the connection region to penetrate a portion of the first epitaxial layer; and
a contact insulating layer interposed between the contact plug and the first epitaxial layer.

18. The image sensor of claim 17, further comprising:
a fixed charge layer that is disposed on the second surface and is in contact with the first epitaxial layer; and
an anti-reflection layer on the fixed charge layer.

19. The image sensor of claim 17, further comprising:
a light-blocking pattern overlapping the pixel separation structure and being disposed on the second surface; and
a low-refractive pattern on the light-blocking pattern, wherein:
the contact plug comprises a barrier pattern and a metal pattern, the barrier pattern conformally covering a side surface of the contact insulating layer, the metal pattern being on the barrier pattern,
the light-blocking pattern and the barrier pattern comprise a first metal, and
the metal pattern comprises a second metal different from the first metal.

20. The image sensor of claim 17, wherein:
the substrate further comprises a single crystalline layer between the first epitaxial layer and the second surface,
the single crystalline layer is doped with the first impurities, and a first concentration of the first impurities doped in the single crystalline layer is higher than a second concentration of the first impurities doped in the first epitaxial layer.

* * * * *